(12) United States Patent
Wiesner

(10) Patent No.: US 8,384,048 B2
(45) Date of Patent: Feb. 26, 2013

(54) CHARGED PARTICLE BEAM DEFLECTION METHOD WITH SEPARATE STAGE TRACKING AND STAGE POSITIONAL ERROR SIGNALS

(75) Inventor: John C. Wiesner, Castro Valley, CA (US)

(73) Assignee: Multibeam Corporation, Santa Clara, CA (US)

( * ) Notice: Subject to any disclaimer, the term of this patent is extended or adjusted under 35 U.S.C. 154(b) by 452 days.

(21) Appl. No.: 12/146,331

(22) Filed: Jun. 25, 2008

(65) Prior Publication Data

US 2008/0315112 A1 Dec. 25, 2008

Related U.S. Application Data

(60) Provisional application No. 60/946,131, filed on Jun. 25, 2007.

(51) Int. Cl.
*G01N 23/00* (2006.01)
(52) U.S. Cl. ............... 250/491.1; 250/396 R; 250/492.2
(58) Field of Classification Search ............... 250/491.1
See application file for complete search history.

(56) References Cited

U.S. PATENT DOCUMENTS

| | | | |
|---|---|---|---|
| 4,494,004 A * | 1/1985 | Mauer et al. ............... | 250/492.2 |
| 5,502,306 A * | 3/1996 | Meisburger et al. .......... | 250/310 |
| 5,784,166 A * | 7/1998 | Sogard .......................... | 356/509 |
| 6,107,636 A * | 8/2000 | Muraki ....................... | 250/492.2 |
| 6,355,994 B1 | 3/2002 | Andeen et al. .................. | 310/15 |
| 6,734,428 B2 | 5/2004 | Parker et al. .................. | 250/310 |
| 6,844,550 B1 * | 1/2005 | Yin et al. ......................... | 850/9 |
| 6,925,478 B2 * | 8/2005 | Jabbari et al. .................. | 708/313 |
| 6,943,351 B2 | 9/2005 | Parker et al. .................. | 250/310 |
| 6,977,375 B2 | 12/2005 | Yin et al. ....................... | 250/310 |
| 7,193,722 B2 * | 3/2007 | Boogaarts et al. ............ | 356/500 |
| 7,248,353 B2 * | 7/2007 | Kimba et al. .............. | 356/237.4 |
| 7,777,202 B2 * | 8/2010 | Satoh et al. ................ | 250/492.2 |
| 2006/0145097 A1 | 7/2006 | Parker ....................... | 250/492.22 |

\* cited by examiner

*Primary Examiner* — Phillip A Johnston
(74) *Attorney, Agent, or Firm* — Robert O. Groover, III; Groover & Associates PLLC; Seth Horwitz

(57) ABSTRACT

The invention provides a method for patterning a resist coated substrate carried on a stage, where the patterning utilizes a charged particle beam. The method comprises the steps of: moving the stage at a nominally constant velocity in a first direction; while the stage is moving, deflecting the charged particle beam in the first direction to compensate for the movement of the stage, the deflecting including: (a) compensating for an average velocity of the stage; and (b) separately compensating for the difference between an instantaneous position of the stage and a calculated position based on the average velocity. The separately compensating step uses a bandwidth of less than 10 MHz. The invention also provides a deflector control circuit for implementing the separate compensation functions.

20 Claims, 16 Drawing Sheets

CHARGED PARTICLE BEAM DEFLECTION METHOD WITH SEPARATE STAGE TRACKING AND STAGE POSITIONAL ERROR SIGNALS

CROSS-REFERENCE TO RELATED APPLICATIONS

This application claims the benefit of U.S. Provisional Application Ser. No. 60/946,131, filed Jun. 25, 2007, which is incorporated by reference herein.

BACKGROUND OF THE INVENTION

1. Field of the Invention

This invention relates generally to the field of charged particle beam deflection, and more particularly to devices and methods used to compensate for both average stage velocity and stage velocity errors when deflecting a charged particle beam across the surface of a substrate carried on the stage.

2. Description of the Related Art

Almost all electron beam systems require means for deflecting the electron beam(s) across the surface of a substrate. This beam deflection is generally accomplished using either electrostatic or magnetic multipoles which generate electric or magnetic fields transverse to the beam direction, thereby inducing side-ways deflection forces to the electron beam as it passes through these deflection elements. The electrostatic and/or magnetic deflection elements require electronic drive circuits capable of generating precise voltages and/or currents to control the electrostatic and/or magnetic deflectors, respectively.

One important application of electron beams is electron-beam lithography (EBL). Examples of EBL systems include Gaussian-beam raster-scanned systems, single shaped beam systems, and electron projection lithography (EPL) systems using masks. Charged particle beam lithography systems also include focused ion beam systems, masked ion beam lithography (MIBL) systems, etc. EBL is regularly used to write masks and reticles needed for the patterning of integrated circuits (ICs) on semiconductor wafers. Recently, interest is growing in the application of EBL for the direct patterning of ICs on wafers—called electron-beam direct-writing (EBDW). The electron beam is focused onto the wafer surface as either a Gaussian beam or a patterned beam, and the electron beam then exposes a resist, which is next developed to produce the pattern, as is familiar to those skilled in the art. For maximum throughput, a writing method called "write-on-the-fly" is commonly used. In this method, the wafer is supported by a wafer stage, typically having at least two axes of motion (X and Y), and often also having additional Z or Yaw motions, as well. The dimensions of modern ICs are now in the 10's of nm range, thus the patterning of ICs necessarily requires very precise positioning of the electron beam being used to write these patterns. Write-on-the-fly requires the wafer to move continuously under the electron beam(s). In most electron beam systems to date, a single writing beam was employed. Recent EBL systems employ multiple electron beams writing simultaneously on the same wafer to increase throughput.

During the write-on-the-fly EBL process, the wafer typically moves in a serpentine pattern, back and forth in a raster pattern. While the wafer is moving, for example parallel to the Y-axis, the beam is deflected along the X-axis to write patterns within a "stripe" which may extend across the entire wafer in a single beam system, or which may be smaller (e.g., 30 mm) in a multiple-beam EBL system. Generally the stage motors are very precisely controlled to move the stage at a pre-determined speed (usually constant). A number of laser interferometers are commonly used to measure the stage position to a resolution <0.1 nm. In EBL systems, the stage position measurements may be used to generate corrective signals for the beam deflectors to enable the electron beam to be correctly positioned on the wafer to accuracies <1 nm, even though the stage mechanical positioning errors may be in excess of 1 µm.

Since the wafer stage control is very precise, it is almost always the case that the stage velocity is held to within a small percentage of the nominal value (typically <1%). One commonly-used approach is to use the stage position data from the laser interferometers to generate a beam deflection signal, which will thus allow the beam to be positioned on the wafer independent of wafer motion. The use of laser interferometers to measure the stage position is described in U.S. Pat. No. 6,355,994 B1, issued Mar. 12, 2002, incorporated herein by reference.

The disadvantage of this simple approach is that very high bandwidth is required to track the stage motion using the laser interferometer data. This can be seen from the fact that at 30 mm/s stage velocity, the stage will move 0.5 nm every 16.67 ns. If 0.5 nm is the maximum acceptable pattern location error, then the beam deflection must update the beam deflection data no less frequently than every 16.67 ns (60 MHz rate). There is a need for a beam deflection system that can allow for high resolution beam placement, without the cost and difficulty of very high bandwidth data processing.

SUMMARY OF THE INVENTION

The present invention is a method of configuring a charged particle beam deflection system to take advantage of the fact that stage velocity errors are much smaller than the nominal stage velocity. This means that in a write-on-the-fly system, most of the wafer motion with respect to the charged particle beam column is predictable, since it can be almost entirely attributed to the nominal stage velocity, with only small perturbations due to errors in the actual instantaneous stage velocity. This deflection method combines two deflection signals: 1) a low-speed, larger amplitude, signal which compensates for assumed motion of the stage at the nominal velocity, and 2) a small amplitude, signal which compensates for any small stage velocity deviations from the nominal velocity. In the deflection signal sent to the beam deflectors, these two deflection signals would be added.

Commonly, an EBL apparatus will incorporate a secondary deflection means ("subfield deflector," SFD). Taking into account the need for very rapid pattern element positioning, while preserving accuracy and precision, the wide range deflection requirement is allocated to a mainfield deflector (MFD), with a relaxed requirement on speed (on account of the requirement for range) and a much smaller deflection requirement for the SFD, but with the requirement of high speed. In this case, the MFD does not directly position the beams, but rather positions a reference coordinate of the SFD, while the SFD then is caused to position the beams in an additive fashion.

The essence of the inventive step is the separation of the requirement for tracking a moving stage's actual position into two parts: (1) the motion with a smooth, predicted average velocity, and (2) the differential motion arising from the differences ("errors") between the instantaneous ideal stage position as predicted from the desired average velocity on the one hand, and the instantaneous, measured actual stage position. The two parts are additive and can be linearly separated.

If, as is usual, the means for the mechanical stage control continuously act to correct the actual stage velocity to the average velocity, the instantaneous errors are small and relatively slowly varying, and can be treated with standard apparatus engineering means, while tracking the average velocity involves high speed operations with quantities changing over relatively large ranges in time.

The present invention provides a method for patterning a resist coated substrate carried on a stage, where the patterning utilizes a charged particle beam. According to aspects of the invention, the method comprises the steps of: moving the stage at a nominally constant velocity in a first direction; while the stage is moving, deflecting the charged particle beam in the first direction to compensate for the movement of the stage, the deflecting including: (a) compensating for an average velocity of the stage; and (b) separately compensating for the difference between an instantaneous position of the stage and a calculated position based on the average velocity. The separately compensating step uses a bandwidth of less than 10 MHz.

Further aspects of the invention include a deflector control circuit for implementing the separate compensation functions. Furthermore, the separate control functions may be directed to separate deflectors—a mainfield deflector and a sub-field deflector, as described above.

DETAILED DESCRIPTION

Figure 16:
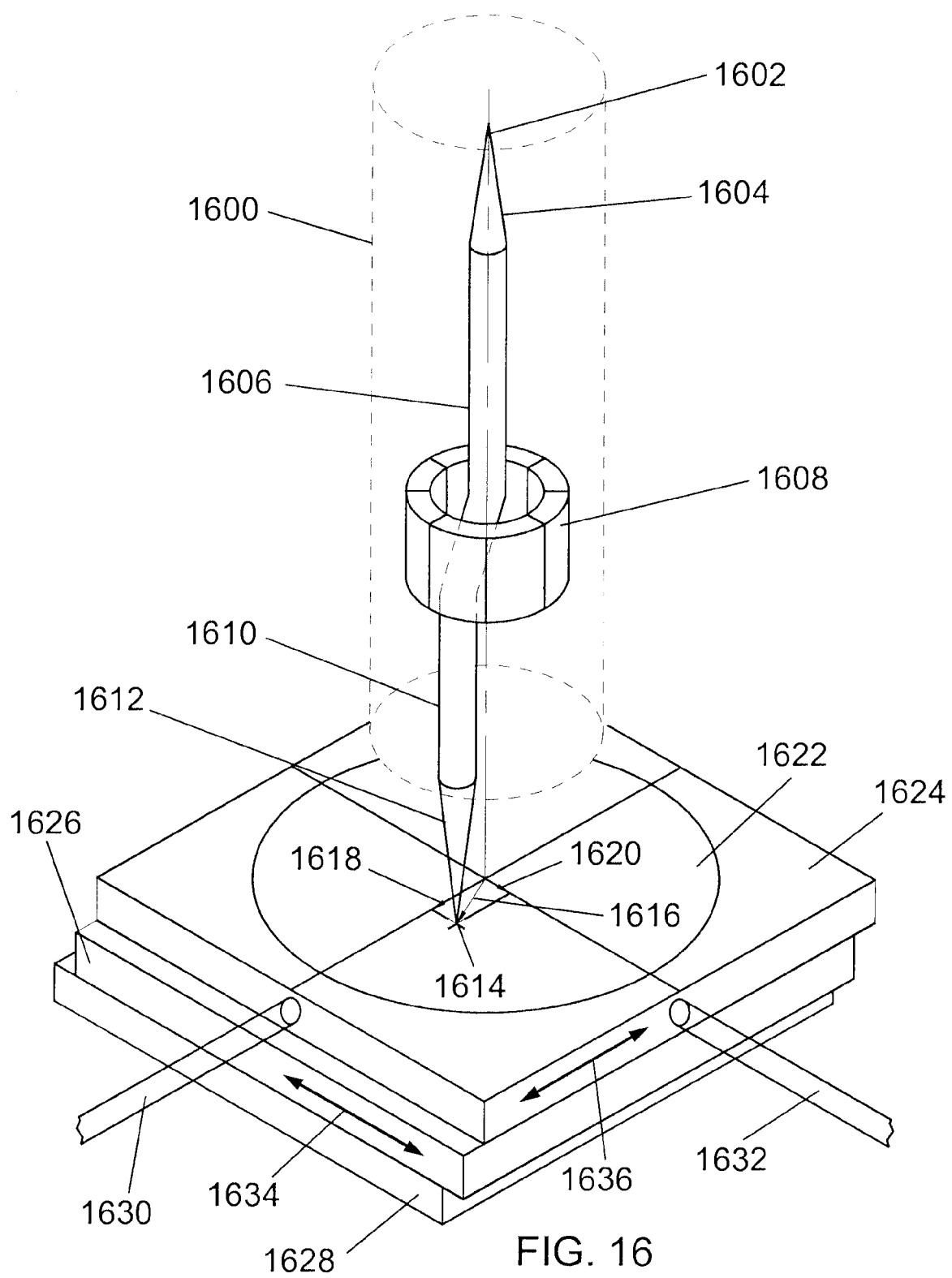
FIG. 16 is a schematic isometric view of a charged particle column focusing a beam on a wafer supported by an X-Y stage with interferometer position measurement.

FIG. 16 is a schematic isometric view of a charged particle column 1600 focusing a beam 1612 on a wafer 1622 supported by an X-Y stage with interferometer position measurement. For the purposes of this discussion, assume that the charged particle beam is an electron beam. Electrons are emitted from a source tip at 1602 (electron emitter tip not shown), forming a diverging beam 1604. Diverging beam is focused by a lens (not shown) into an approximately parallel beam 1606, centered on the axis of column 1600. Beam 1606 enters an X-Y beam deflector 1608, emerging as deflected beam 1610. Deflected beam 1610 is then focused by a second lens (not shown) onto the surface of wafer 1622.

Wafer 1622 is supported by a wafer stage comprising three plates: a top plate 1624 which is mounted on a center plate 1626. The center plate is mounted on the base plate 1628 which is fixedly attached to a vacuum enclosure (not shown) surrounding the stage and column 1600. Arrow 1634 illustrates the motor-driven (motor not shown) relative motion between center plate 1626 and base plate 1628—this defines a first stage motion axis. Laser beam 1632 measures motion along the first stage motion axis. Arrow 1636 illustrates the motor-driven (motor not shown) relative motion between top plate 1624 and center plate 1626—this defines a second stage motion axis. Note that the overall motion of the top plate 1624 (and wafer 1622) relative to column 1600 is the combination of the motions along the first and second stage motion axes, enabling full X-Y motion of the wafer 1622 relative to column 1600.

The beam deflections induced by deflector 1608 are shown as arrow 1618 (parallel to the second stage motion axis) and arrow 1620 (parallel to the first stage motion axis). Arrow 1616 is the vector sum of arrows 1618 and 1620—i.e., the overall beam deflection at the wafer relative to the axis of column 1600.

Figure 1:
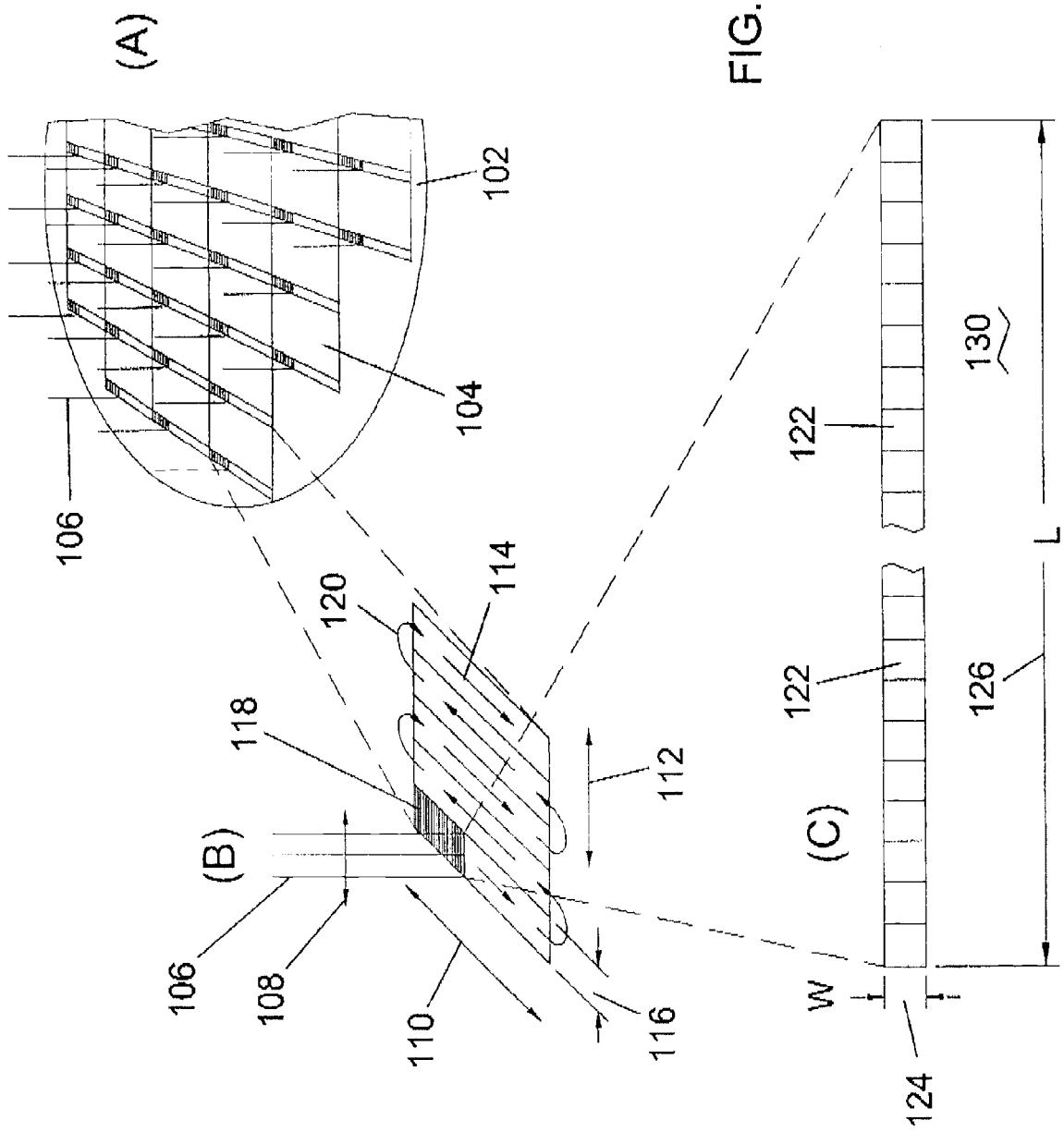
FIG. 1 is a schematic illustration of a writing strategy employing the beam deflection method of the present invention.

Examples of beam deflectors and electron beam lithography columns are given in U.S. Patent Publ. Ser. No. 2006/0145097 A1, published Jul. 6, 2006, U.S. Pat. No. 6,977,375 B2, issued Dec. 20, 2005, U.S. Pat. No. 6,734,428 B2, issued May 11, 2004, and U.S. Pat. No. 6,943,351 B2, issued Sep. 13, 2005, all incorporated by reference herein. FIG. 1 is a schematic illustration of a writing strategy employing the beam deflection method of the present invention. In view (A), a wafer 102 is shown being written by multiple charged particle beams 106. For the sake of clarity, within this document, beams 106 will be interpreted as electron beams, however, all of the following description applies to the case of ion beams as well. Also, the beams will be described as writing on the surface of a wafer, however, a mask or other substrate is equally applicable to the present invention. Each of the multiplicity of electron beams 106 is shown writing a square area 104 on wafer 102. The present invention is applicable to the case of single electron beams writing on a wafer or a mask, as well as to the case shown here of multiple electron beams writing on a wafer or mask.

View (B) shows a close-up of a single writing area 104 from FIG. 1(A)—this is an area of the wafer 102 being written by a single electron beam 106. During the write-on-the-fly process, the wafer is in continuous motion along stage fast motion axis 110 under electron beam 106 which is scanned by a deflection system (not shown) along direction 108, which is generally perpendicular to stage fast motion axis 110. In the case of telecentric beam scanning, beam 106 remains perpendicular to the surface of the wafer as it scans side-to-side along direction 108 as shown in FIG. 1(B). Beam 106 is moved a distance 116 along direction 108, as the stage moves along axis 110, thereby enabling beam 106 to expose resist within a writing stripe 118. When the stage as moved the full length of the writing area 104 along the direction of the stage fast motion axis 110, the beam is blanked while the stage steps along the stage stepping axis 112 a distance equal to the width of writing stripe 118 measured parallel to the stage stepping axis 112 (see arrow 120). This type of stage trajectory is commonly called "serpentine", as is familiar to those skilled in the art. The wafer stage then moves back in the opposite direction along stage fast motion axis 110 until it has traveled the full dimension of the writing area 104 measured parallel to the stage fast motion axis 110. At the end of each stripe, the stage must undergo a deceleration and an acceleration in the reverse direction, if there is another stripe to be exposed. The stage must accelerate to the precomputed stage speed and hold the speed approximately constant, while the stage error correction system has caught up and has stabilized.

This process is repeated until the entire writing area 104 has been exposed using beam 106 according to a pre-determined desired writing pattern—arrow 114 illustrates the wafer stage travel while writing the last stripe.

View (C) is a close-up illustration of a single "frame" 130 in the writing pattern. The length 126, L, of the frame corresponds to the width of the writing stripe in view (B). The width 124, W, of the frame corresponds to the dimension of a square subfield 122. Within each subfield 122, there are typically a large number of patterns to be exposed ("flashed") in the resist using beam 106. These exposures require that the beam 106 be positioned at the desired location of each "flash". This positioning process will generally employ two beam deflectors, each of which may comprise one or more electrostatic and/or magnetic multipole elements. Examples of typical deflectors would be electrostatic octupoles, or magnetic quadrupoles. The particular choice of deflector is not part of the present invention. A mainfield deflector may be used to position the beam 106 at the center of a particular subfield, and a subfield deflector may then be used to vector beam 106 around within the subfield to position beam 106 at each desired flash location. Thus the requirements for the mainfield deflector are typically:

1) Lower bandwidth (since the beam stays within each subfield while all flashes are written in resist),
2) High precision (since the mainfield deflection range is so large compared to the minimum deflection field step size),
3) Low noise—(since electrical noise on the deflector will cause unwanted motion of the beam).

The requirements for the subfield deflector are typically:

1) High bandwidth (since the beam must vector within the subfield to each successive flash location),
2) Smaller deflection field (since the subfield need only address locations within the subfield dimension which is much less than the frame length L),
3) Lower precision (since the size of the minimum deflection field step size is a larger fraction of the subfield size, fewer bits of resolution are required to define flash locations within a subfield).

Table I shows example parameters for the mainfield and subfield deflectors, and writing area 104.

TABLE I

Various example parameters for the mainfield deflector (MFD), subfield deflector (SFD), and writing area 104.

| Parameter | Units | MFD | SFD |
|---|---|---|---|
| Scan field | um | 100 | 4 |
| Minimum deflection step size | nm | 0.5 | 0.5 |
| Scan field/step size | | 200000 | 8000 |
| Min # address bits required | | 18 | 13 |
| Flash time (including settling time) | ns | | 25 |
| Typical # flashes per subfield | | | 100 |
| Dwell time per subfield | us | | 2.5 |
| Square writing area 104 | mm | 30 | |
| Number of stripes | | 300 | |
| Number of frames per stripe | | 15000 | |
| Number of subfields in frame | | 50 | |

Figure 2:
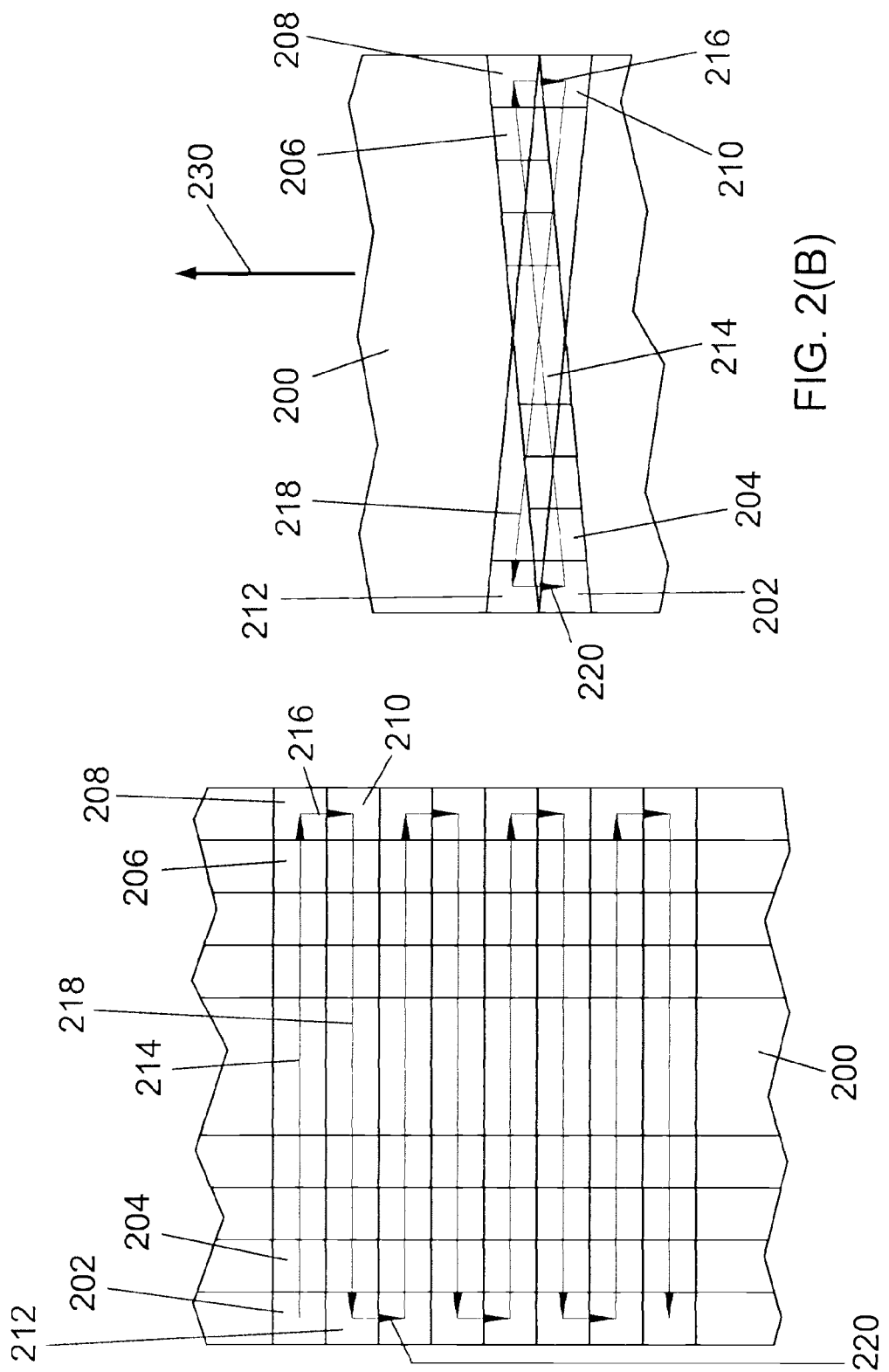
FIG. 2 is a close-up schematic view of beam deflection in the frame of the wafer, and in the frame of the writing column.

FIG. 2(A) is a close-up schematic view of beam deflection in the frame of the wafer 106. Writing stripe 200 contains a multiplicity of frames as shown, each frame containing a multiplicity of subfields. For example, the uppermost frame in FIG. 2(A) contains subfields 202, 204, . . . , 206, and 208, where a number of subfields are omitted between subfields 204 and 206 for clarity. In this view, the motion of the wafer 102 is neglected and arrows 214 and 218 represent beam deflections due to the mainfield deflector. Along arrow 214, the beam is first positioned at the center of subfield 202 by the mainfield deflector. The subfield deflector then vectors the beam around within subfield 202 to position the beam at each successive flash location. The flashing process comprises three steps:

1) the blanked beam is vectored to the flash position,
2) the beam is unblanked for the required time to accomplish the proper amount of resist exposure, and
3) the beam is then blanked again.

This process repeats for each desired flash within subfield 202 until all required patterns within subfield 2-2 have been flashed. Next, the mainfield deflector moves the beam a distance W to the center of subfield 204, and the above process is repeated for all desired flashes within subfield 204. After all subfields within the frame are fully written (i.e., the mainfield deflector has positioned the beam at the end of arrow 214 which is the center of subfield 208), the mainfield deflector moves the beam down a distance W equal to the width of the frame, which is also the dimension of a square subfield (see arrow 216).

The subfield deflector then vectors the beam around within subfield 210 as described above for subfields 202, 204, 206, and 208. After all flashes are written within subfield 210, the mainfield deflector moves the beam a distance W to the left along arrow 218. Once all the flashes within subfield 212 (the last subfield within the second frame) have been written, the mainfield deflector moves the beam down a distance W equal to the width of the frame (see arrow 220). Note that in the frame of the wafer, the beam deflections 214 and 218 due to the mainfield deflector are parallel to each other and are along the frame long axis (length L). The beam deflections 216 and 220 are parallel to the stage fast motion axis 110 in FIG. 1(B). Since we have neglected the wafer motion in view (A), this view is in the frame of the wafer and the column and the associated electron beam are interpreted as moving downwards in FIG. 2(A) at the same velocity that the wafer is actually moving upwards—see arrow 230 in view (B). Since all motion between the wafer and electron beam is relative, the writing results would be the same in FIGS. 2(A) and 2(B).

Since in standard design practice, the column is fixed and the wafer moves (supported by a wafer stage), FIG. 2(B) shows the actual beam deflection situation: the wafer is moving upwards (arrow 230) and the column is fixed. The subfield labeling corresponds to that in FIG. 2(A). Subfields 202, 204, 206, 208, 210, and 212 are shown at the time they are being written by the electron beam 106 in FIG. 1. Subfield 202 is written first, and since the wafer is moving upwards along arrow 230, subfield 202 is therefore shown a slight distance lower than subfields 204 (written next), and subfields 206 and 208 (written later). The stage velocity parallel to arrow 230 must be set so that the writing time for the frame comprising subfields 202, 204, 206, and 208 (as well as the subfields between 204 and 208, not shown) is on average the same as the time taken for the stage to move a distance W along the stage fast motion axis 110 in FIG. 1. This is illustrated here by the fact that subfield 210 is exactly at the same vertical position in FIG. 2(B) as subfield 202. Because the wafer is moving continuously during writing, arrows 214 and 218 are angled in view (B) and are no longer parallel to the long axis of the frames (and thus are also no longer parallel to the stage stepping axis 112 in FIG. 1). The important consideration for the present invention is that the stage motion along the fast motion axis 110 is generally held to high precision by a stage control system (not shown and not part of the present invention). Any errors in the stage velocity with respect to the nominal stage velocity will represent small deviations in the positions of the various subfields in a frame during the write-on-the-fly process. However, as illustrated in FIGS. 11-15, these deviations will, in general, still require the deflection system to apply a corrective beam deflection in order to locate the beam during flashing to within pre-determined positioning requirements.

Note that subfields 202, 204, 206, 208, 210, and 212 are shown as parallelograms in FIG. 2B, although they are shown as squares in FIG. 2(A). This is because when the stage motion (arrow 230) is taken into account, during the time required to write all flashes within a subfield, the stage undergoes motion. For example, if the flashes within subfield 202 are written from left-to-right in the figure (individual flashes are not shown), then the wafer has moved up a small distance when the rightmost flashes are written, compared to the position of the wafer when the leftmost flashes were written—this is shown symbolically by the parallelogram shapes in FIG. 2(B). Also note that subfields 210 and 212 are skewed in the opposite direction from subfields 202, 204, 206, and 208 since we assume the flashes in subfields 210 and 212 are written right-to-left. This is because subfields 210 and 212 are in the frame being written in the direction of arrow 218, while subfields 202, 204, 206, and 208 are written in the direction of arrow 214.

Figure 3:
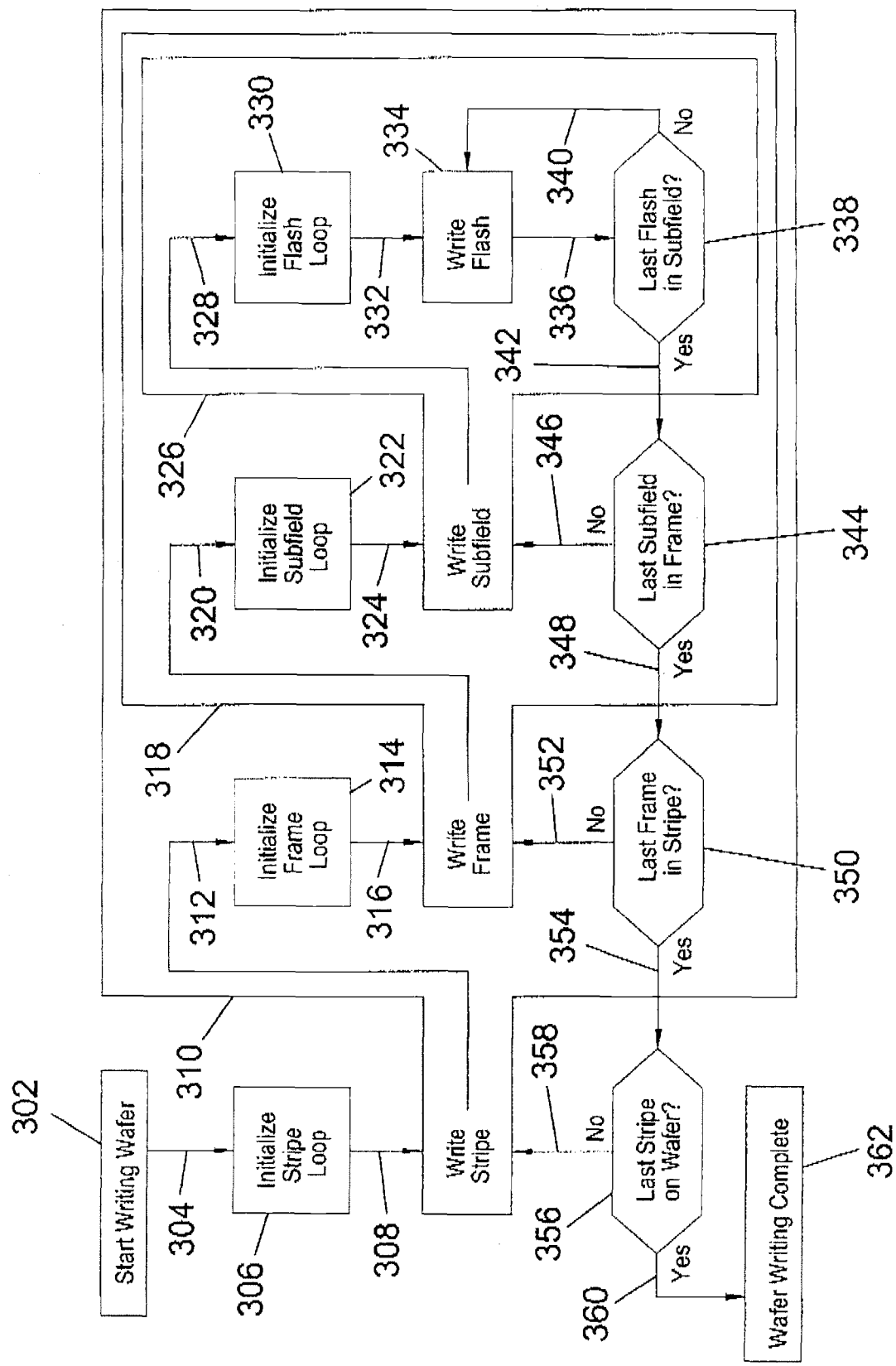
FIG. 3 is a flowchart for the writing process, illustrating the hierarchical structure.

FIG. 3 is a flowchart for the writing process, illustrating the hierarchical structure consisting of stripes, frames, subfields, and flashes. A number of stripes are written within writing area 104 (see FIG. 1), and within each stripe there are a large number of frames, each containing a number of subfields, which, in turn, contain varying numbers of flashes. After all the flashes within a particular subfield are written, writing of the next subfield within a frame starts. Once all the subfields within a particular frame are written, writing of the next frame within that stripe begins. Once all the frames within a stripe are written, writing of the next stripe begins (see FIG. 1). After all the stripes within the writing area are written (see area 104 in FIG. 1), the wafer is completely patterned. In a single-beam system, writing area 104 would correspond to the entire wafer or mask. In a multiple-beam system, writing area 104 would correspond to a subset of the full wafer or mask. In either case, the flowchart shown here is applicable.

Block 302 is the start of the writing process, where the pattern data has already been broken down into a large number of flashes. These flashes are allocated to certain stripes, frames and subfields based on their absolute locations within a particular pattern, to be written and where that pattern is located on the wafer.

Start Writing Wafer block 302 provides data through link 304 to Initialize Stripe Loop block 306—this data includes the number of stripes, and initializes the stripe loop to start at the first stripe. Link 308 then transfers the loop data to Write Stripe block 310.

Link 312 triggers Initialize Frame Loop block 314 to set the number of frames in the stripe and initializes the frame loop to start at the first frame. Link 316 transfers the frame data to Write Frame block 318.

Link 320 triggers Initialize Subfield Loop block 322 to set the number of subfields in the frame and initializes the subfield loop to start at the first subfield. Link 324 transfers the subfield data to Write Subfield block 326.

Link 328 triggers Initialize Flash Loop block 330 to set the number of flashes in the subfield and initializes the flash loop to start at the first flash. Link 332 transfers the flash data to Write Flash block 334. After each flash, link 336 transfers the flash number to decision block 338.

If the flash just written is not the last flash in the subfield, then link 340 leads back to Write Flash block 334, and another flash is written within the current subfield. If the flash just written is the last flash in the subfield, then link 342 leads out of Write Subfield block 326 to decision block 344.

If the subfield just completed is not the last subfield in the frame, then link 346 leads to Write Subfield block 326, and writing begins on the next subfield. If the subfield just completed is the last subfield in the frame, then link 348 leads out of Write Frame block 318 to decision block 350.

If the frame just completed is not the last frame in the stripe, then link 352 leads to Write Frame block 318, and writing begins on the next frame. If the frame just completed is the last frame in the stripe, then link 354 leads out of Write Stripe block 310 to decision block 356.

If the stripe just completed is not the last stripe in writing area 104 (see FIG. 1), then link 358 leads to Write Stripe block 310, and writing begins on the next stripe. If the stripe just completed is the last stripe in writing area 104, then link 360 leads to Wafer Writing Complete block 362.

Figure 4:
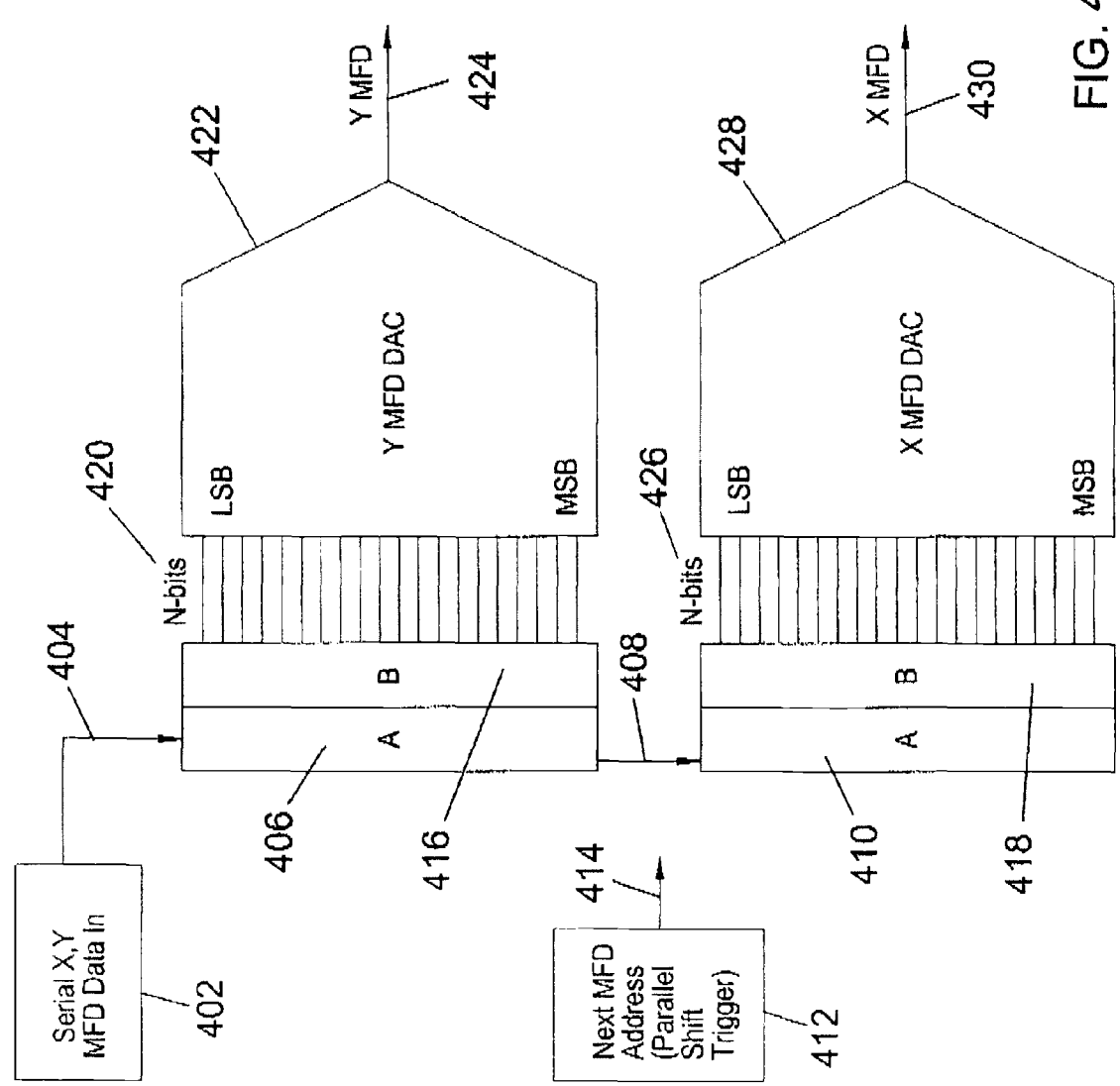
FIG. 4 is a schematic diagram of circuits for generating the X MFD and Y MFD signals.

FIG. 4 is a schematic diagram of circuits for generating the X MFD and Y MFD signals. This circuit represents one embodiment of the present invention in which 2N-bits of serial mainfield deflector (MFD) data from block 402 is fed through link 404 to shift register 406, and then through link 408 to shift register 410. Taking into account the positions of the most-significant bits (MSB) and least-significant bits (LSB) of the Y MFD DAC 422 and the X MFD DAC 428, the incoming serial data structure is:

X(MSB) . . . X(LSB)Y(MSB) . . . Y(LSB)

Where the X(MSB) bit is first, and the Y(LSB) is last, in the serial data stream coming from block 402 along link 404 into shift register 406. The number of bits in each of shift registers 406 and 410 is N-bits (callouts 420 and 426, respectively). Once all 2N-bits have been loaded into the serially-connected shift-registers 406 and 410, block 412 triggers the loading of the X and Y MFD data from shift register 416 into Y MFD DAC 422, and from shift register 418 into X MFD DAC 428. Here, we assume that X and Y MFD data has previously been loaded into shift registers 416 and 418. Simultaneously with the data loading into DACs 422 and 428, data from shift registers 406 and 410 is loaded into shift registers 416 and 418. This transfer sequence is performed such that the data exiting shift registers 416 and 418 into DACs 422 and 428, respectively, leaves one clock step before the data entering shift registers 416 and 418 from shift registers 406 and 408, respectively, as is familiar to those skilled in the art. Y MFD DAC 422 generates the Y mainfield deflector voltage on line 424, while X MFD DAC generates the X mainfield deflector voltage on line 430. The voltages on lines 424 and 430 correspond to the scan voltages required to position the beam at the center of the subfields shown in FIG. 2(A) along arrows 214 and 218—i.e., the subfield center locations neglecting the effects of stage motion shown in FIG. 2(B). The voltages on lines 424 and 430 do not take into account the motion of the wafer due to the nominal stage velocity or the motion of the wafer due to stage positional errors.

Figure 5:
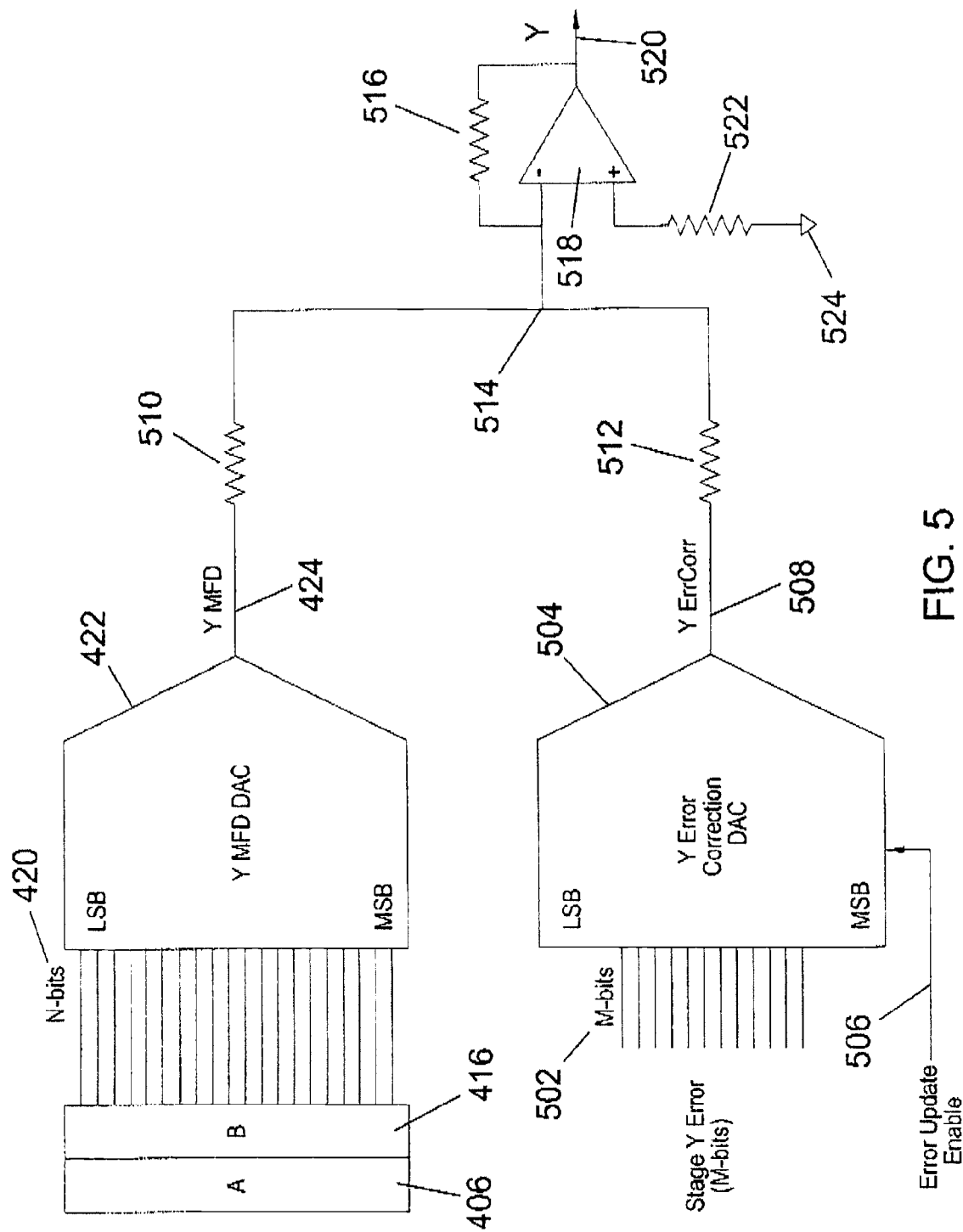
FIG. 5 is a schematic diagram of a first circuit for combining the Y MFD signal with the Y ErrCorr signal.

FIG. 5 is a schematic diagram of a first circuit for combining the Y MFD signal with the Y ErrCorr signal. An identical circuit could be used to combine the X MFD and X ErrCorr signals. The schematic circuit diagram in FIG. 4 corresponds to the generation of only a Y MFD signal—this signal would be the beam deflection in the case where the wafer was fixed and the column mechanically moved with a steady velocity, as illustrated in FIG. 2(A). Now, suppose that the wafer is still fixed, but there are errors in the column velocity relative to the wafer so that the column no longer moves always at the nominal speed. Again, this is not the case for a real system—the column is generally fixed with the wafer moving under the column—we use this illustration only for the purpose of showing the combination of the two signals shown here, prior to the addition of the stage tracking signal of the present invention in FIGS. 8 and 9. Shift registers 406 and 416, Y MFD DAC 422, N-bit callout 420, and output line 424 are as shown in FIG. 4. We now want to add an additional signal corresponding to the wafer stage Y-axis error, measured to a precision of M-bits (callout 502). The wafer stage position is assumed to be measured using instrumentation (not shown) such as laser interferometers, as is familiar to those skilled in the art. When a new set of Stage Y Error data bits has been loaded onto the input lines to Y Error Correction DAC 504, the Error Update Enable line 506 triggers the loading of the updated M-bits of data into Y-Error Correction DAC 504, thereby generating a Y ErrCorr signal on line 508.

A standard analog op-amp inverting summing circuit is shown in this example, where the following currents are generated:

$$I_{YMFD}=V_{YMFD}/R_{510}$$

$$I_{YErrCorr}=V_{YErrCorr}/R_{512}$$

where the resistance of resistor i is $R_i$ and i=510, 512, 516, and 522. Because the voltage at summing junction 514 is a virtual ground, the voltages across resistors 510 and 512 are approximately equal to the output voltages 424 and 508 of DACs 422 and 504, respectively, as shown in the formulas above. Op-amp 518 operates in a standard analog inverting summation configuration, where the voltage at output line 520 of op-amp 518 is:

$$V_{520}=-(I_{YMFD}+I_{YErrCorr})R_{516}$$

The value of resistor 522, $R_{522}$, connected from the positive input of op-amp 518 to ground 524, is chosen to equalize the effective impedances at the negative and positive inputs of op-amp 518, as is familiar to those skilled in the art:

$$R_{522}=1/(1/R_{510}+1/R_{512}+1/R_{516}).$$

Figure 6:
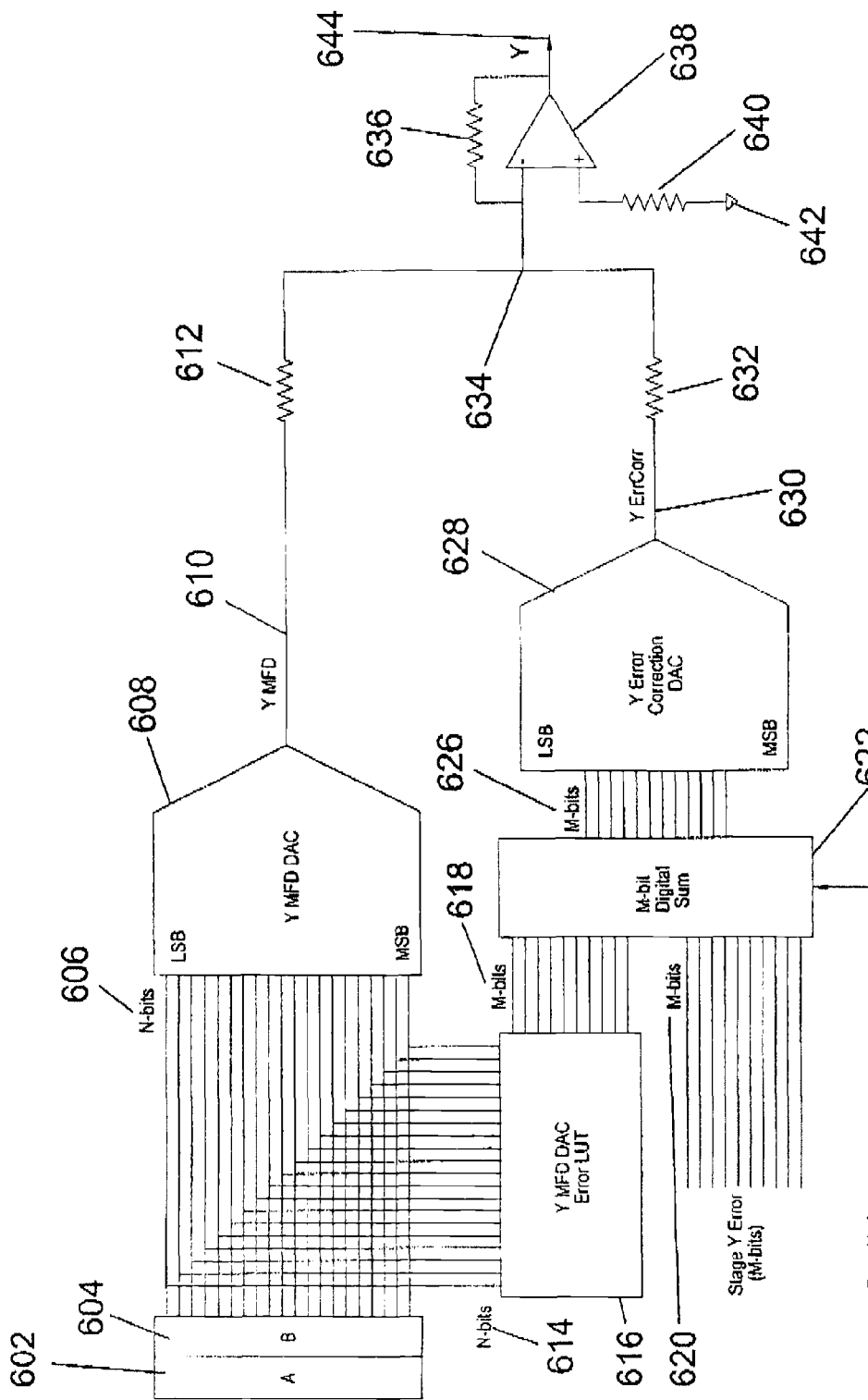
FIG. 6 is a schematic diagram of a second circuit for combining the Y MFD signal with the Y ErrCorr signal.

FIG. 6 is a schematic diagram of a second circuit for combining the Y MFD signal with the Y ErrCorr signals. This is an alternative to the circuit shown in FIG. 5, where an additional capability has been added—the ability to correct for non-linearities in the Y MFD DAC using a look-up table (LUT). This example again supposes that the wafer is fixed (as in FIG. 5), but now there are errors in the column velocity relative to the wafer so that the column no longer moves always at the nominal speed. Again, this is not the case for a real system—the column is generally fixed with the wafer moving under the column—we use this illustration only for the purpose of showing the combination of the two signals shown here, prior to the addition of the stage tracking signal of the present invention in FIGS. 8 and 9. Shift registers 602 and 604 correspond with shift registers 406 and 416, respectively, differing only in the added connections 614 to the Y MFD DAC Error LUT 616. Y MFD DAC 608, N-bit callout 606, and output line 610, correspond to Y MFD DAC 422, N-bit callout 420, and output line 424 in FIG. 4, respectively. We now add an additional signal corresponding to the wafer stage Y-axis error, measured to a precision of M-bits (callout 620). The wafer stage position is assumed to be measured using instrumentation (not shown) such as laser interferometers, as is familiar to those skilled in the art. When a new set of Stage Y Error data bits has been loaded onto the input lines to M-bit Digital Sum 622, the Error Update Enable line 624 triggers the loading of the updated M-bits of data into M-bit Digital Sum 622.

The added circuitry in FIG. 6, compared with FIG. 5, provides a correction for (previously-measured) non-linearities in the output of Y MFD DAC 608. The parallel output lines from shift register 604 lead to the inputs (N-bits wide, callout 614) of Y MFD DAC Error LUT 616. The output from Y MFD DAC Error LUT 616 is M-bits wide (callout 618), connected to M inputs to M-bit Digital Sum 622. The outputs (M-bits wide, callout 626) from M-bit Digital Sum 622 connect to the inputs of Y Error Correction DAC 628. The Y ErrCorr signal on output line 630 is thus the result of two summed M-bit input signals: 1) the Stage Y Error, and 2) the output from the Y MFD DAC Error LUT 616.

A standard analog op-amp inverting summation circuit is shown in this example, where the following currents are generated:

$$I_{YMFD}=V_{YMFD}/R_{612}$$

$$I_{YErrCorr}=V_{YErrCorr}/R_{632}$$

where the resistance of resistor i is $R_i$ and i=612, 632, 636, and 640. Because the voltage at summing junction 634 is a virtual ground, the voltages across resistors 612 and 632 are approximately equal to the output voltages of DACs 608 and 628, respectively, as shown in the formulas above. Op-amp 638 operates in a standard analog inverting summation configuration, where the voltage at output line 644 of op-amp 638 is:

$$V_{644}=-(I_{YMFD}+I_{YErrCorr})R_{636}$$

The value of resistor 640, $R_{640}$, connected from the positive input of op-amp 638 to ground 642, is chosen to equalize the effective impedances at the negative and positive inputs of op-amp 638, as is familiar to those skilled in the art:

$$R_{640}=1(1/R_{612}+1/R_{632}+1/R_{636}).$$

Figure 7:
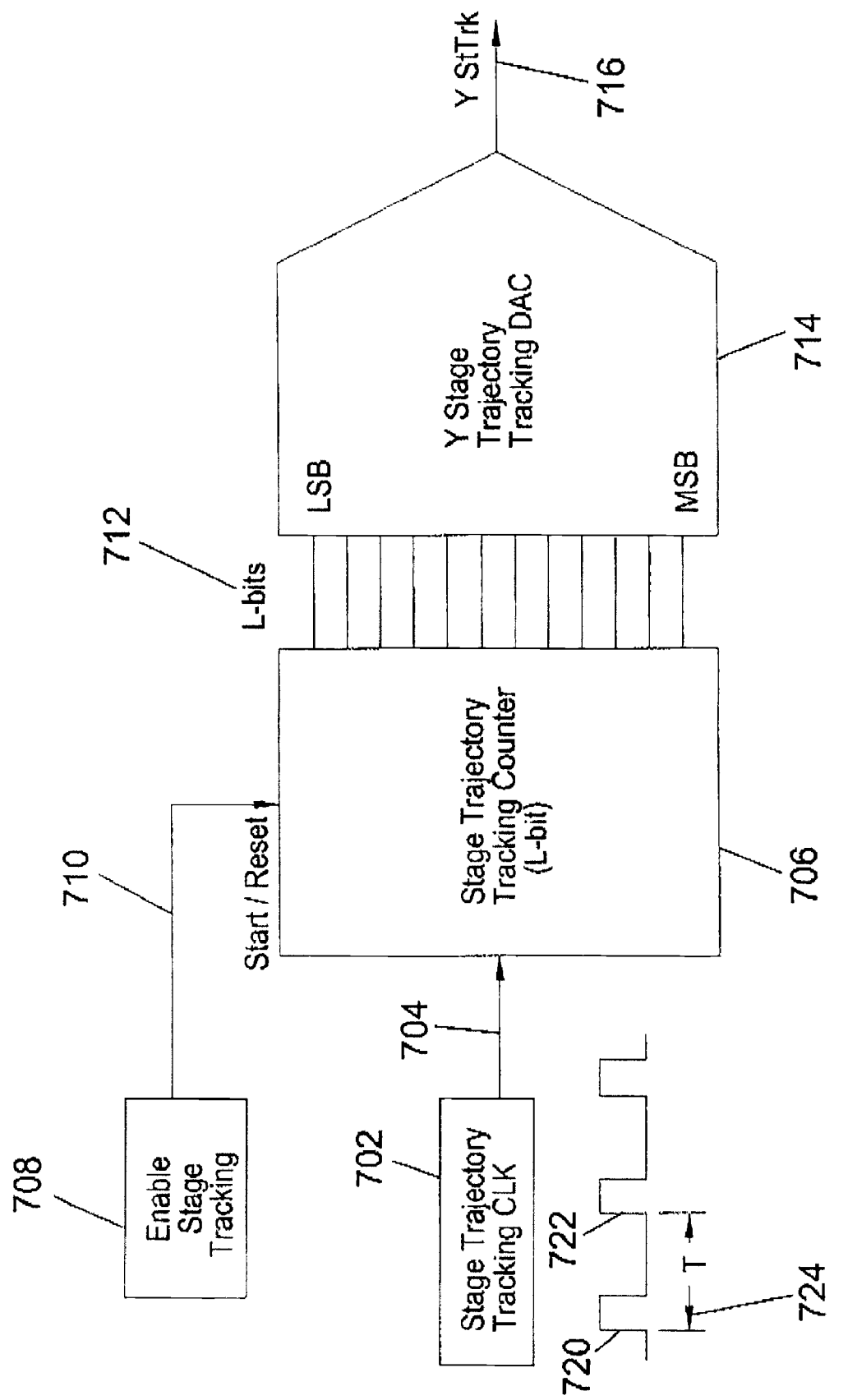
FIG. 7 is a schematic diagram of a circuit for generating the Y-axis stage trajectory tracking signal, Y StTrk.

FIG. 7 is a schematic diagram of a circuit for generating the Y-axis stage trajectory tracking signal, Y StTrk. A key element of the present invention is the separation of the Stage Tracking signal generated by the circuit in FIG. 7 from the Stage Error signal shown in FIGS. 5 and 6. The basic concept is that although there will be errors in the stage velocity, i.e., the stage velocity will not always be at the nominal value, for example, 30 mm/s, these errors will be proportionately very small relative to the stage velocity (see FIGS. 11-15). Thus, to account for the stage velocity (by deflecting the beam) it is preferred to separate out two signals:

Stage Tracking—a low bandwidth, high precision, large amplitude, signal generated on the assumption that the stage is traveling at the nominal stage velocity, which need not be assumed to be constant, but which is assumed to be slowly-varying relative to the rate of stage position error measurements, Stage Error Measurement—a high bandwidth, low precision, small amplitude, signal derived from the wafer stage positional measurement system (e.g., laser interferometers), representing measured deviations of the stage position (in near real-time) from the expected position of the stage if it were traveling exactly at the nominal stage velocity.

The Stage Trajectory Tracking Clock 702 generates a steady stream of clock pulses, such as 720 and 722, with an interval 724, T:

$$T = D/V_{nom}$$

where

D=beam displacement at the wafer corresponding to an LSB of Y Stage Trajectory Tracking DAC 714 (see FIGS. 8 and 9), and $V_{nom}$=the nominal wafer stage velocity.

As an example, if the stage velocity is 30 mm/s and the minimum deflection step is 0.5 nm, then the clock rate would be:

T=(0.5 nm)/(30 mm/s)=16.67 ns (corresponding to 60 MHz).

Clock pulses from Stage Trajectory Tracking CLK 702 are fed to Stage Trajectory Tracking Counter 706 through link 704. Start and Reset control of Stage Trajectory Tracking Counter 706 is through link 710 from Enable Stage Tracking block 708. The function of the Enable Stage Tracking block 708 is to coordinate the stage trajectory tracking ramp to the wafer stage motion, including control of the ramp direction (ramp up, or ramp down), and starting and stopping the ramp. L-bits (callout 712) of data from Stage Trajectory Tracking Counter 706 are fed in parallel to Y Stage Trajectory Tracking DAC 714 which generates the stage trajectory tracking ramp signal, Y StTrk, on line 716.

Figure 8:
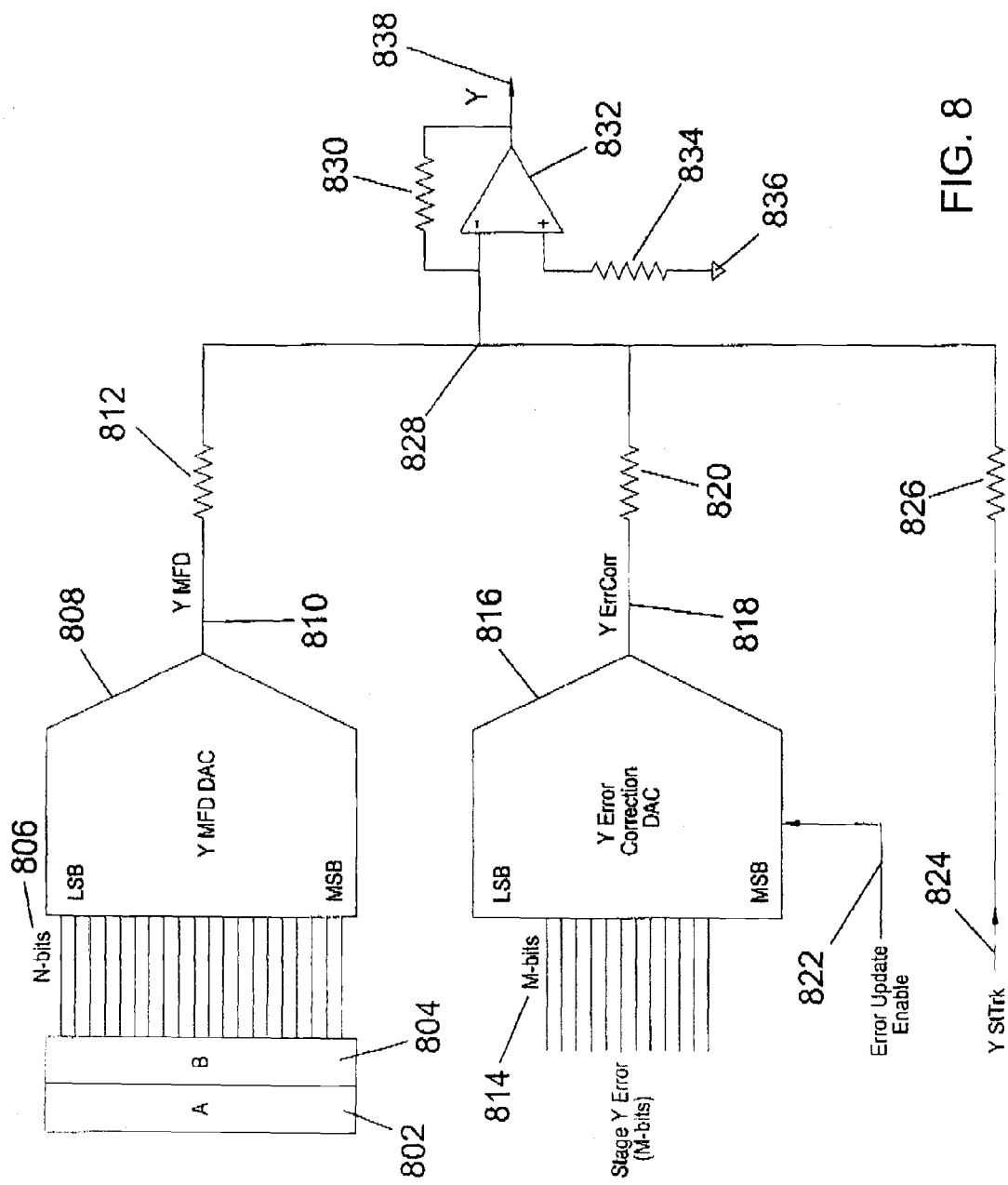
FIG. 8 is a schematic diagram of a first circuit for combining the Y MFD signal, the Y ErrCorr signal, and the Y StTrk signal.

FIG. 8 is a schematic diagram of a first circuit for combining the Y MFD signal, the Y ErrCorr signal, and the Y StTrk signal. FIG. 8 is similar to FIG. 5, with the addition of a third signal, Y StTrk, connected to the Op-Amp summing junction 828 through resistor 826. The correspondences between callouts in FIGS. 5 and 8 are as shown in Table II.

The functional difference between FIGS. 5 and 8 is the addition of a third signal, the Y StTrk signal 824. The three currents into summing junction 828 are:

$$I_{YMFD} = V_{YMFD}/R_{812}$$

$$I_{YErrCorr} = V_{YErrCorr}/R_{820}$$

$$I_{YStTrk} = V_{YStTrk}/R_{826}$$

TABLE II

Correspondences between callouts in FIGS. 5 and 8.

| ELEMENT | FIG. 5 | FIG. 8 |
|---|---|---|
| Shift Register A | 406 | 802 |
| Shift Register B | 416 | 804 |
| N-bits callout | 420 | 806 |
| Y MFD DAC | 422 | 808 |
| Y MFD Output | 424 | 810 |
| Y MFD summing resistor | 510 | 812 |
| Stage Y Error M-bits callout | 502 | 814 |

TABLE II-continued

Correspondences between callouts in FIGS. 5 and 8.

| ELEMENT | FIG. 5 | FIG. 8 |
|---|---|---|
| Error Update Enable | 506 | 822 |
| Y Error Correction DAC | 504 | 816 |
| Y Error Correction Output | 508 | 818 |
| Y Error Correction summing resistor | 512 | 820 |
| Op-Amp summing junction | 514 | 828 |
| Op-Amp feedback resistor | 516 | 830 |
| Op-Amp | 518 | 832 |
| Op-Amp Output | 520 | 838 |
| Op-Amp positive input resistor | 522 | 834 |
| Ground | 524 | 836 | where the resistance of resistor i is $R_i$ and i=812, 820, 826, 830, and 834. Because the voltage at summing junction 828 is a virtual ground, the voltages across resistors 812, 820, and 826 are equal to the output voltages 810 and 818 of DACs 808 and 816, respectively, and Y StTrk signal 824, as shown in the formulas above. Op-amp 832 operates in a standard analog inverting summation configuration, where the voltage at output line 838 of op-amp 832 is:

$$V_{838} = -(I_{YMFD} + I_{YErrCorr} + I_{YStTrk})R_{830}$$

The value of resistor 834, $R_{834}$, connected from the positive input of op-amp 832 to ground 836, is chosen to equalize the effective impedances at the negative and positive inputs of op-amp 832, as is familiar to those skilled in the art:

$$R_{834} = 1/(1/R_{812} + 1/R_{820} + 1/R_{826} + 1/R_{830}).$$

Figure 9:
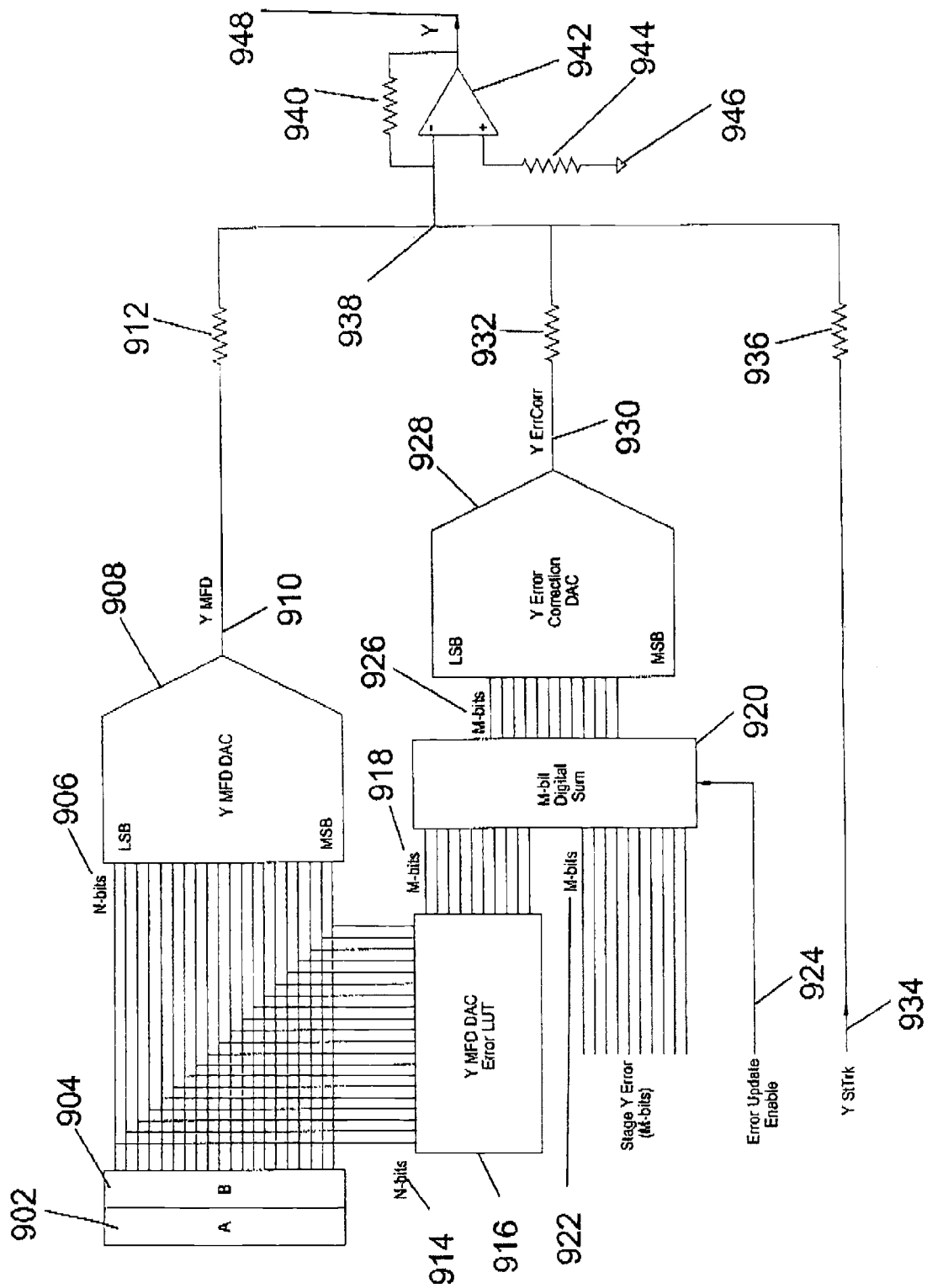
FIG. 9 is a schematic diagram of a second circuit for combining the Y MFD signal, the Y ErrCorr signal, and the Y StTrk signal.

FIG. 9 is a schematic diagram of a second circuit for combining the Y MFD signal, the Y ErrCorr signal, and the Y StTrk signal. FIG. 9 is similar to FIG. 6, with the addition of a third signal, Y StTrk, connected to the Op-Amp summing junction 938. The correspondences between callouts in FIGS. 6 and 9 are as shown in Table III.

The functional difference between FIGS. 6 and 9 is the addition of a third signal, the Y StTrk signal 934. The three currents into summing junction 928 are:

$$I_{YMFD} = V_{YMFD}/R_{912}$$

$$I_{YErrCorr} = V_{YErrCorr}/R_{932}$$

$$I_{YStTrk} = V_{YStTrk}/R_{936}$$

where the resistance of resistor i is $R_i$ and i=912, 932, 936, 940, and 944. Because the voltage at summing junction 938 is a virtual ground, the voltages across resistors 912, 932, and 936 are approximately equal to the output voltages of DACs 908 and 928, and the Y StTrk signal 934, respectively, as shown in the formulas above. Op-amp 942 operates in a standard analog inverting summation configuration, where the voltage at output line 948 of op-amp 942 is:

$$V_{948} = -(I_{YMFD} + I_{YErrCorr} + I_{YStTrk})R_{940}$$

The value of resistor 944, $R_{944}$, connected from the positive input of op-amp 942 to ground 946, is chosen to equalize the effective impedances at the negative and positive inputs of op-amp 942, as is familiar to those skilled in the art:

$$R_{944} = 1/(1/R_{912} + 1/R_{932} + 1/R_{936} + 1/R_{940}).$$

TABLE III

Correspondences between callouts in FIGS. 6 and 9.

| ELEMENT | FIG. 6 | FIG. 9 |
|---|---|---|
| Shift Register A | 602 | 902 |
| Shift Register B | 604 | 904 |
| N-bits callout | 606 | 906 |
| Y MFD DAC | 608 | 908 |
| Y MFD Output | 610 | 910 |
| Y MFD summing resistor | 612 | 912 |
| N-bits callout | 614 | 914 |
| Y MFD DAC Error LUT | 616 | 916 |
| M-bits callout | 618 | 918 |
| Stage Y Error M-bits callout | 620 | 922 |
| Error Update Enable | 624 | 924 |
| M-bit Digital Sum | 622 | 920 |
| M-bit callout | 626 | 926 |
| Y Error Correction DAC | 628 | 928 |
| Y Error Correction Output | 630 | 930 |
| Y Error Correction summing resistor | 632 | 932 |
| Op-Amp summing junction | 634 | 938 |
| Op-Amp feedback resistor | 636 | 940 |
| Op-Amp | 638 | 942 |
| Op-Amp Output | 644 | 948 |
| Op-Amp positive input resistor | 640 | 944 |
| Ground | 642 | 946 |

Figure 10:
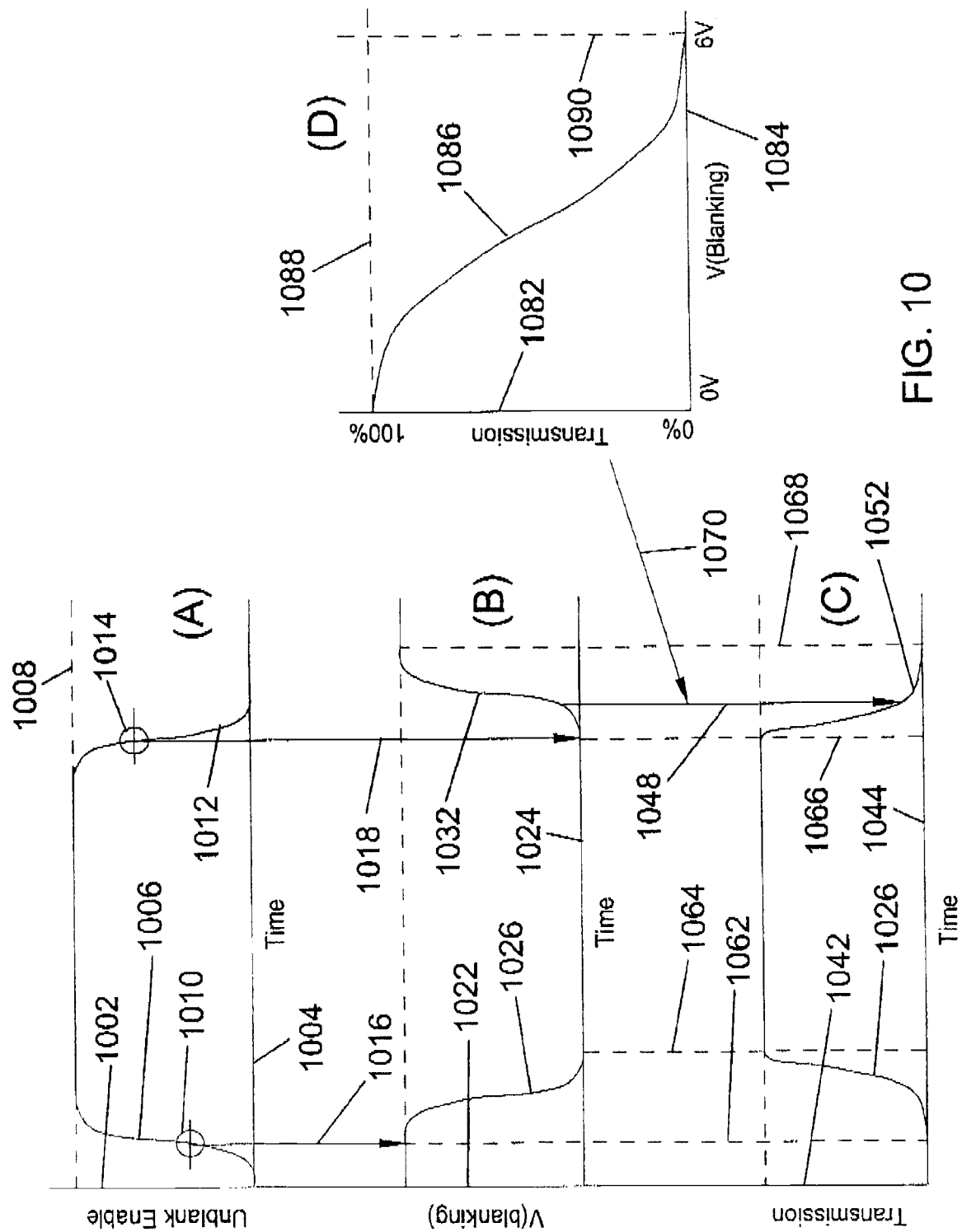
FIG. 10 is a schematic illustration of the Unblank Enable, V(blanking), and Beam Transmission fraction, as functions of time.

FIG. 10(A) shows Unblank Enable signal 1002 as a function of Time 1004. Unblank Enable signal 1002 is typically provided by a pattern generator (not shown). Point 1010 on the rising edge 1006 of the waveform triggers unblanking (arrow 1016). Point 1014 on the falling edge 1012 of the waveform triggers blanking (arrow 1018). The maximum Unblank Enable voltage is at dashed line 1008—it is important that level 1008 be far enough above the voltage levels at points 1010 and 1014 that noise on the Unblank Enable waveform cannot inadvertently trigger an incorrect blanking or unblanking signal.

View (B) shows the blanking voltage 1022, V(blanking), as a function of Time 1024. The beam is blanked when V(blanking) is at a high level as shown left of dashed line 1062. When the Unblank Enable signal 1002 triggers unblanking (arrow 1016), V(blanking) 1022 starts to decrease, producing falling edge 1026. When the Unblank Enable signal triggers blanking (arrow 1018), V(blanking) starts to increase, producing rising edge 1032. When V(blanking) is at 0 V, the beam is fully unblanked (see view D).

View (C) shows the beam Transmission fraction 1042 as a function of Time 1044. When the transmission fraction reaches the maximum amount (ideally 100%), the beam is fully unblanked—this is the case between dashed lines 1064 and 1066, corresponding to the interval over which V(blanking) is 0 V in view (B). The rise 1026 and fall 1052 in beam transmission result from the graph in view (D).

View (D) shows the beam Transmission 1082 as a function of V(blanking) 1084. As expected, when V(blanking) is 0 V, maximum (100% shown here) transmission is achieved, while for some positive V(blanking) value (6 V in this example), beam Transmission drops to 0%. Curve 1086 gives the conversion between the V(blanking) graph in view (B) and the Transmission graph in view (C).

FIGS. 11-15 show a numerical example to illustrate the advantages of the present invention. A 5 kHz oscillation of the wafer stage along the stage fast motion axis 110 (see FIG. 1) is assumed, and the resulting velocity, velocity error, position, and positional error curves are then calculated.

Figure 11:
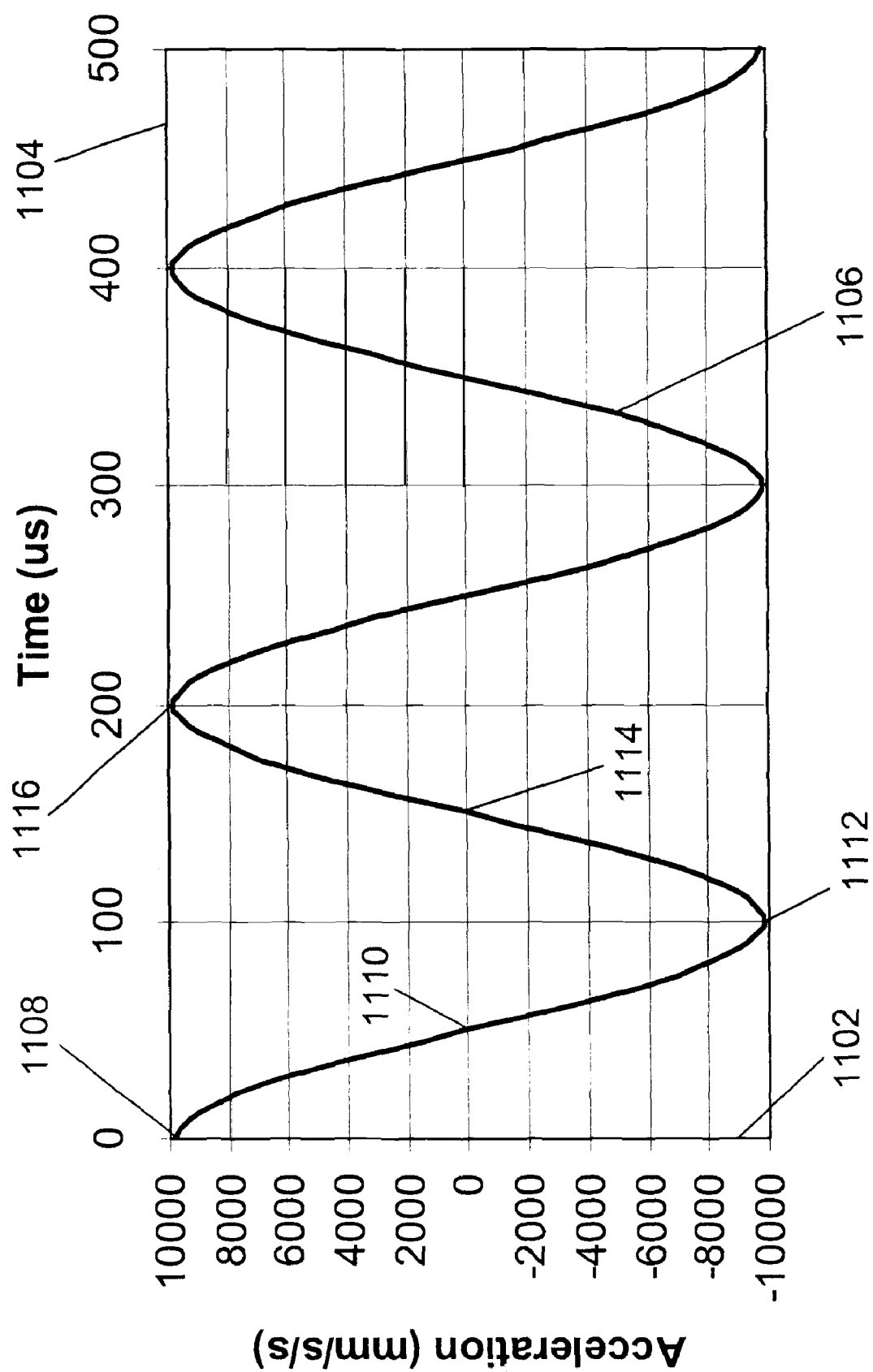
FIG. 11 is a graph of stage acceleration plotted against time.

FIG. 11 is a graph of stage Acceleration 1102 plotted against Time 1104 for an example of a wafer stage with ±1 g acceleration (i.e., 9800 mm/s$^2$) at a frequency of 5 kHz, giving a period of 200 µs. The acceleration ranges from +9800 mm/s$^2$ (speeding up the stage) to −9800 mm/s$^2$ (slowing down the stage). This represents a fairly extreme example of stage velocity (and position) error. Over intervals of 50 µs, the stage acceleration 1106 ranges from +9800 mm/s$^2$ at point 1108, to 0 mm/s$^2$ at point 1110, to −9800 mm/s$^2$ at point 1112, to 0 mm/s$^2$ at point 1114, and finally back to +9800 mm/s$^2$ at point 1116. A sinusoidal variation in acceleration is assumed—this represents an absence of higher-order harmonics (10 kHz, 15 kHz, etc.) in the oscillation.

Figure 12:
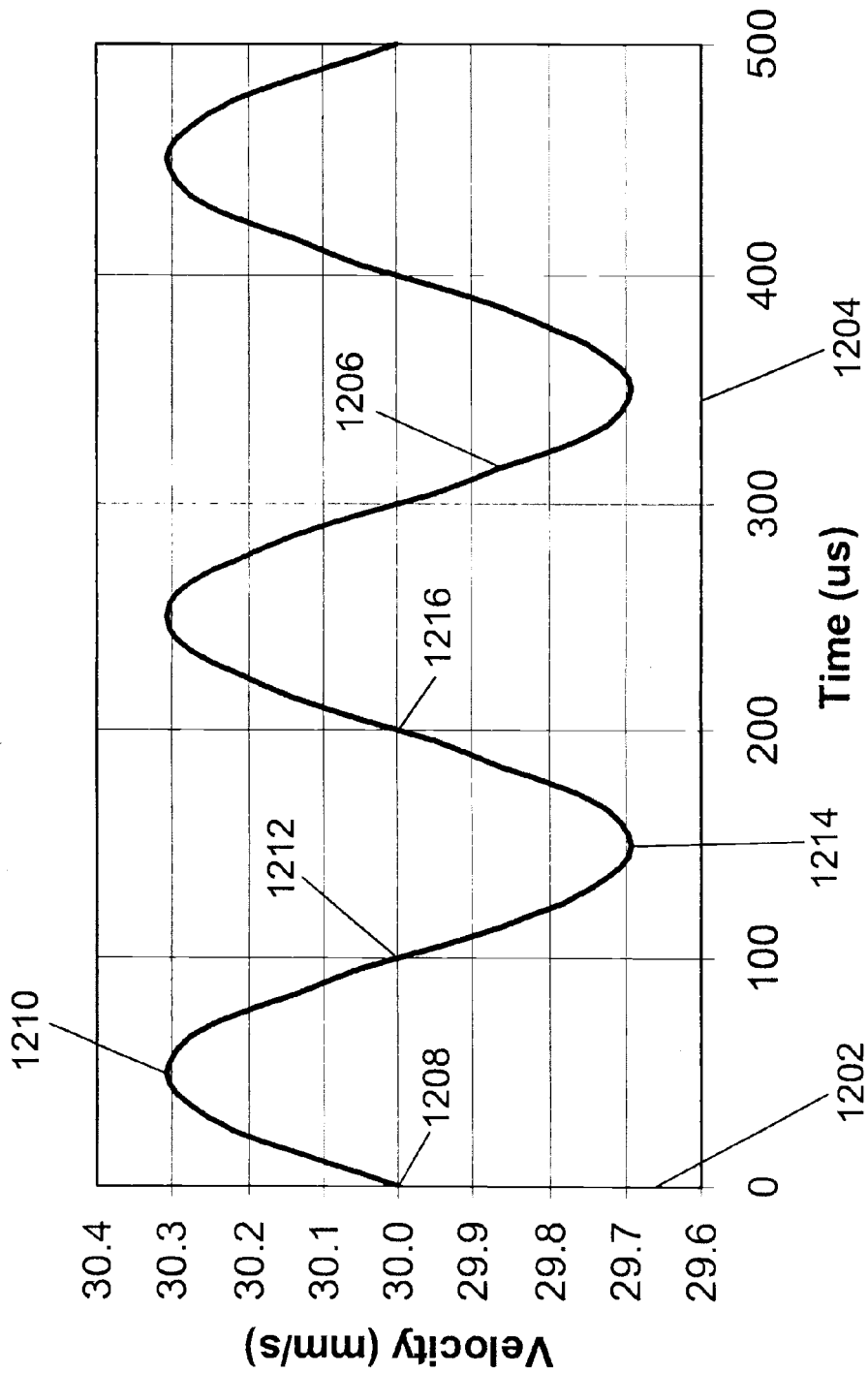
FIG. 12 is a graph of stage velocity plotted against time.

FIG. 12 is a graph of stage Velocity 1202 plotted against Time 1204 for the wafer stage acceleration graphed in FIG. 11. At point 1208, the wafer stage is at its nominal velocity of exactly 30 mm/s. The effect of the positive acceleration between points 1108 and 1110 in FIG. 11 is to increase the velocity between points 1208 and 1210, as expected. Note that the total velocity error at point 1210 is about 0.3 mm/s, or 1% of the nominal stage velocity. The correlation between the wafer stage velocity at points 1208, 1210, 1212, 1214, and 1216 with the wafer stage acceleration in FIG. 11 is as expected. The velocity variation 1206 is sinusoidal, given the assumption in FIG. 11 of no higher harmonics above the fundamental 5 kHz frequency.

Figure 13:
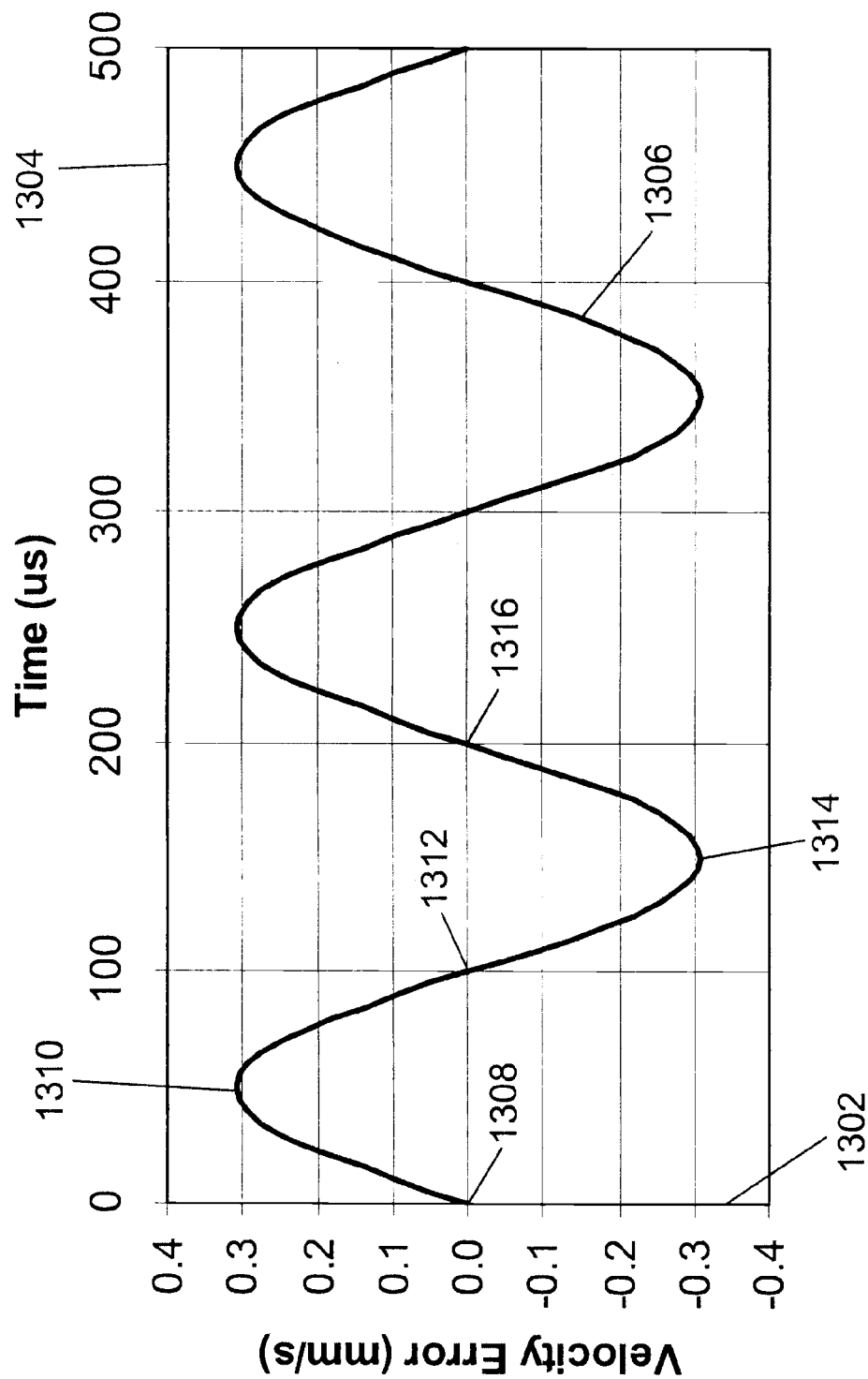
FIG. 13 is a graph of stage velocity error relative to the nominal stage velocity plotted against time.

FIG. 13 is a graph of stage Velocity Error 1302 relative to the nominal stage velocity (30 mm/s) plotted against Time 1304. This graph is the same as FIG. 12, but offset by 30 mm/s. At point 1308, the stage velocity error is 0 mm/s since the stage is assumed to start at the correct velocity. Points 1308, 1310, 1312, 1314, and 1316 show the sinusoidal variation in the stage velocity error 1306 from 0 µs to 200 µs, which is one full cycle of the assumed 5 kHz oscillation.

Figure 14:
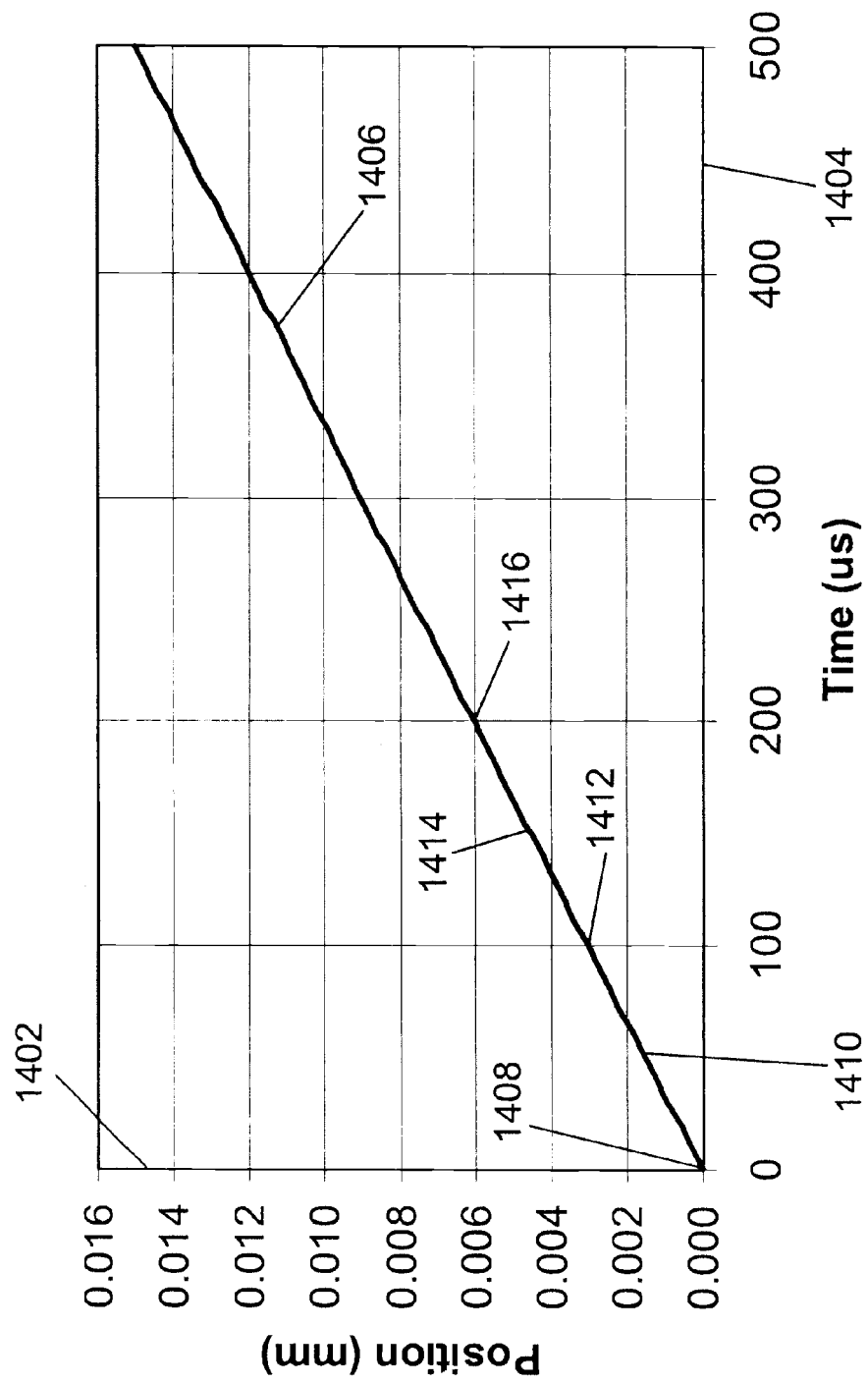
FIG. 14 is a graph of stage position plotted against time.

FIG. 14 is a graph of stage Position 1402 plotted against Time 1404. Because the stage velocity errors were in the 1% range (see FIG. 12), the overall stage position is almost linear from 0 µs to 500 µs, over 2.5 full cycles of the assumed 5 kHz oscillation. The stage positions at points 1408, 1410, 1412, 1414, and 1416 fall on almost a straight line 1406. The stage position is basically a result of the nominal stage velocity, with only minor perturbations due to variations in the stage velocity arising from various effects such as imperfections in the stage tracks or rollers, electrical variations in the stage drive motors, etc. This illustrates the benefit of the present invention—this large-scale effect of the nominal stage velocity can be compensated for using a pre-determined voltage ramp (the Y StTrk signal), while stage positional errors (defined as positional deviations from the predicted position which would arise from the stage always traveling at the nominal velocity) can be corrected with a much smaller signal (Y ErrCorr).

Figure 15:
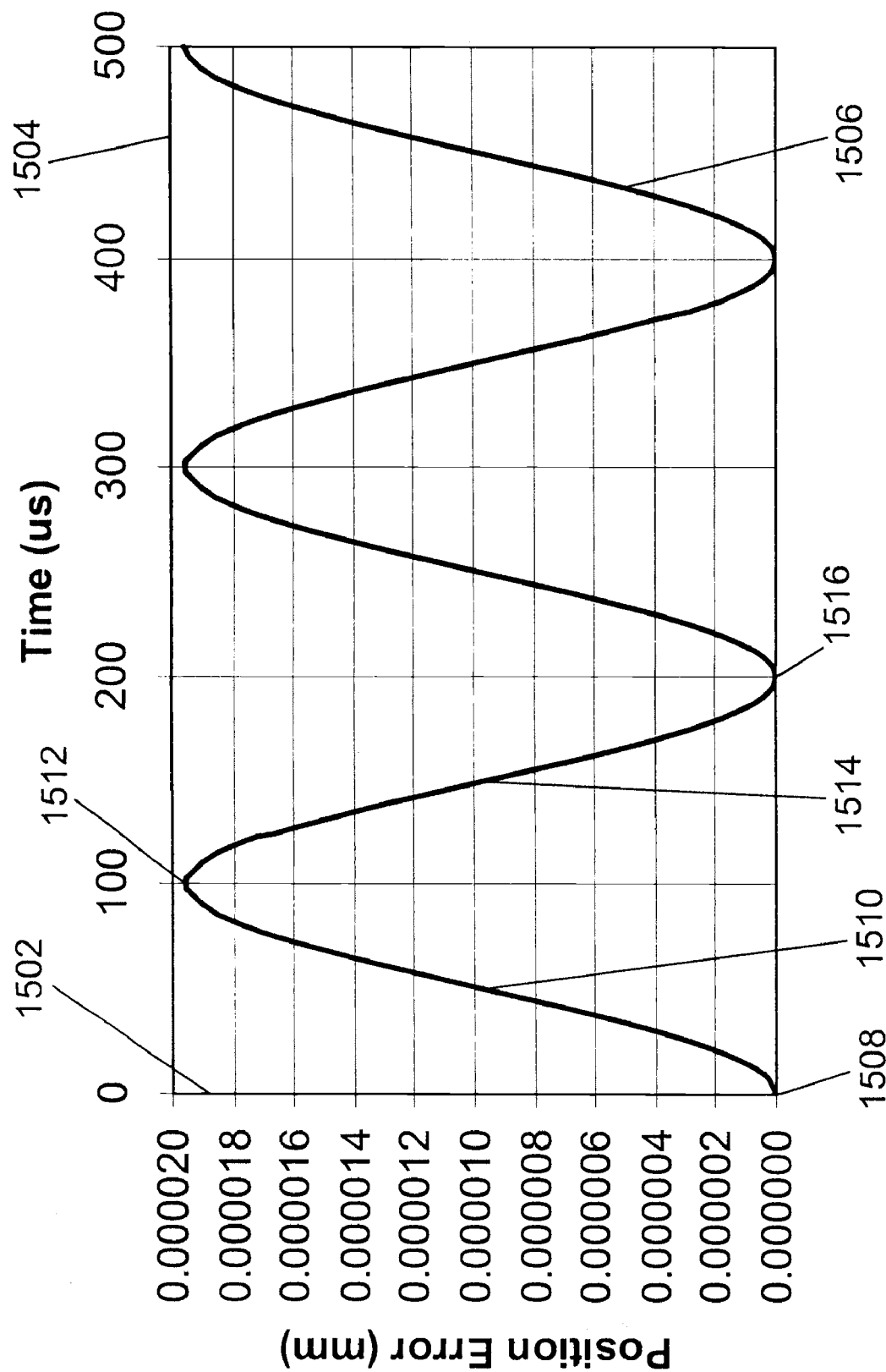
FIG. 15 is a graph of stage position error relative to the nominal stage position plotted against time.

FIG. 15 is a graph of stage Position Error 1502 relative to the nominal stage position plotted against Time 1504. In this graph, the stage position error is defined as:

$$(\text{Stage Position Error}) = (\text{Stage Position}) - (\text{Nominal Stage Velocity})(\text{Time})$$

In this example with a pure 5 kHz sinusoidal oscillation in the stage velocity, the stage position errors at points 1508, 1510, 1512, 1514, and 1516 range from 0 mm up to 0.000020 mm=20 nm. Note that 20 nm may be nearly the full dimension of a flash on the wafer and thus this position error must be corrected for proper wafer patterning. Over the 500 µs interval plotted in FIGS. 11-15, the stage will travel (30 mm/s) (500 µs)=15 µm.

A Numerical Example of a Deflection System

This section describes an electron beam deflection system with representative values for the various design parameters discussed in the sections above. For this discussion, the stripe is oriented in the y-direction (i.e., stage fast motion axis 110 in FIG. 1 is along the Y-axis). Writing a full stripe consists of using the beam to expose flashes on the wafer within individual frames, 100 μm wide in the x-direction, by 2 μm high in the y-direction. Within each frame, 50 square subfields, 2 μm on a side are arranged in a linear array. Within each subfield, the beam exposes a square shape in the size range of 30-50 nm. Refer to FIG. 1 for an illustration of these concepts (see also Table I).

Within a frame, the subfield centers are positioned by the major field deflection (MFD) system. The entire frame is within the scan field of the MFD system. Within a subfield, the beam is deflected to the required exposure position by the subfield deflection (SFD) system. The digital address for the MFD is 20 bits (1 sign bit, plus 19 data bits), with the LSB corresponding to 0.5 nm:

$$(2^{19})(0.5 \text{ nm}) \approx 250 \text{ μm} > 100 \text{ μm scanfield}$$

Thus the full 20-bits provide addressing out to ±250 μm, more than is needed to address the ±50 μm addresses within the 100 μm wide stripe. For the mainfield, as well as for the subfield, the origin of the deflection systems (zero excitation) is at the centers of the respective fields.

As described in FIG. 2(B), the wafer travel during the time required to write a frame is ~2 μm. To achieve a positional resolution in the stage tracking ramp, then at least 12-bits are required:

$$(\text{\# bits resolution in stage tracking ramp}) = \log_2 [(2 \text{ μm})/(0.5 \text{ nm})] = 12\text{-bits}$$

At a stage velocity of 30 mm/s, the required update interval (time T in FIG. 7) would be:

$$(\text{Update Interval } T) = (0.5 \text{ nm})/(30 \text{ mm/s}) = 16.67 \text{ ns}$$

or a 60 MHz clock rate (block 702 in FIG. 7).

Although the above discussion has utilized a particular arrangement of DACs and analog Op-Amp summing circuits, other circuits are also possible for the implementation of the deflection method of the present invention. For example, the op-amp summing circuit could be replaced by a digital summing circuit in an implementation where the individual voltages, Y MFD, Y ErrCorr, and Y StTrk are replaced by multiple-bit binary values. These binary values could be combined digitally using a summation circuit, the output of which could then be fed to a DAC to generate the final deflection voltage. One advantage of this alternative method is the avoidance of possible drift and noise issues which are ever-present in analog summing circuits. A disadvantage of this alternative method is the need for a DAC with both high speed and high precision—these DAC characteristics generally are mutually exclusive, and to achieve both in a single DAC may substantially increase costs for the deflection system.

Another embodiment could be a modification of FIG. 9 with the M-bit digital sum 920 replaced by a second analog summing circuit. To do this, another DAC would be added to the circuit to generate a voltage from the M-bits (callout 918) output from Y MFD DAC Error LUT 916. In this embodiment, DAC 928 would be configured to take the M-bit inputs (callout 922) directly (instead of taking the signals from the M-bit Signal Sum 920). The second analog summing circuit would then combine these two voltages to generate the Y ErrCorr signal, which would then be summed in with the Y MFD signal 910 and the Y StTrk signal 934 as shown in FIG. 9.

Still another embodiment of the present invention would take the first set of M-bits (callout 918) output from Y MFD DAC Error LUT 916 into an M-bit DAC to generate a Y MFD Error signal. The second set of M-bits (callout 922) would go into a second M-bit DAC to generate a Stage Y Error signal. The analog summation circuit could then combine four signals: 1) Y MFD, Y MFD DAC Error, Stage Y Error, and Y StTrk, to give the final deflection voltage.

Either electrostatic or magnetic deflection elements may be used to deflect the beam, given the deflection signals generated by the circuits shown in FIGS. 8 and 9. Although the above description assumes that the stage fast motion axis 110 is parallel to the Y-axis, this is a simplification which is not necessary—the stage fast motion axis could be parallel to the X-axis, or not parallel to either the X- and Y-axes.

Specific numbers for the various scan parameters have been cited as examples—the present invention is also applicable to a wide range of other scan parameters, as well. For example, a wider scan stripe might be used, resulting in a larger number of subfields within each frame. A linear (one-dimensional) array of electron columns could be employed, instead of the two-dimensional array shown in FIG. 1(A)—in this case, the writing stripes might extend over the full dimension of the wafer, for example 200 mm or 300 mm. In all cases, the key requirement for the applicability of the present invention is that any stage velocity errors are very small in comparison to the nominal stage velocity.

While certain representative embodiments and details have been shown for purposes of illustrating the invention, it will be apparent to those skilled in the art that various changes in the methods and apparatus disclosed herein may be made without departing from the scope of the invention which is defined in the appended claims.

What is claimed is:

1. A method for patterning a resist coated substrate carried on a stage, said patterning utilizing a charged particle beam generated by a column positioned above said substrate, comprising the steps of:
    carrying a substrate, which has been coated with resist, on a movable stage;
    moving said stage at a nominally constant velocity in a first direction, while monitoring the instantaneous position of said stage;
    while said stage is moving, deflecting said charged particle beam in said first direction to compensate for the movement of said stage, said deflecting including both:
    compensating for an average velocity of said stage; and
    separately compensating for the difference between an instantaneous position of said stage and a calculated position based on said average velocity; and
    using said beam to pattern said resist.

2. A method as in claim 1, wherein said separately compensating step has a bandwidth of less than 10 MHz.

3. A method as in claim 1, wherein said separately compensating step has a bandwidth of no more than 1 MHz.

4. A method as in claim 1, wherein said instantaneous position of said stage is measured using a laser interferometer system.

5. A method as in claim 1, wherein said compensating step includes deflecting said charged particle beam with a main-field deflector and wherein said separately compensating step includes defecting said charged particle beam with a sub-field deflector.

6. The method of claim 1, wherein the charged particle beam is an electron beam.

7. The method of claim 1, wherein the resist coated substrate is exposed to multiple charged particle beams simultaneously, and each is similarly deflected to compensate for stage movement.

8. The method of claim 1, wherein said separately compensating step uses a combination of digital summing circuitries, analog summing circuitries, and a table look-up.

9. The method of claim 1, wherein the beam has intervals of blanking and unblanking, and said separately compensating step is coordinated with said blanking and unblanking.

10. The method of claim 1, wherein the beam is deflected to write a pattern, and said separately compensating step is coordinated with the timing of writing the pattern.

11. The method of claim 1, wherein at some times the stage is moved in a second direction which is not said first direction, and the beam is additionally deflected in a direction which is not said first direction.

12. The method of claim 1, wherein the beam is deflected both by a mainfield deflector and also by a subfield deflector, and wherein said separately compensating step is applied to control at least said subfield deflector.

13. A method for charged-particle-beam patterning, comprising:
    carrying a substrate which is coated with resist on a movable stage in vacuum, within the field of at least one steerable charged-particle beam;
    moving said stage at a nominally constant velocity in a first direction, while repeatedly measuring the instantaneous position of the stage;
    deflecting the charged-particle beam to compensate for the movement of said stage, said deflecting including:
    compensating for average velocity of said stage, and
    separately compensating for the difference between an instantaneous position of said stage and a calculated position based on said average velocity,
    wherein the separately compensating action has a much lower bandwidth than the step of compensating for average velocity; and
    deflecting the charged-particle beam in a second direction, while also dynamically controlling the intensity of the charged-particle beam, to thereby write a pattern onto the resist.

14. The method of claim 13, wherein the charged particle beam is an electron beam.

15. The method of claim 13, wherein the resist coated substrate is exposed to multiple charged-particle beams simultaneously.

16. The method of claim 13, wherein the beam is deflected both by a mainfield deflector and also by a subfield deflector, and wherein said separately compensating step is applied to control at least said subfield deflector.

17. A method for charged-particle-beam patterning, comprising:
    carrying a substrate which is coated with resist on a movable stage in vacuum, within the field of at least one charged-particle beam;
    moving said stage at a nominally constant velocity, while interferometrically measuring the instantaneous position of the stage,
    modulating and deflecting the charged-particle beam to thereby write a pattern into the resist, and
    deflecting the charged-particle beam to compensate for the movement of said stage, by compensating for average velocity of said stage, and separately compensating for the difference between an instantaneous position of said stage and a calculated position based on said average velocity, wherein the separately compensating action has a much lower bandwidth than the step of compensating for average velocity.

18. The method of claim 17, wherein the charged-particle beam is an electron beam.

19. The method of claim 17, wherein the resist coated substrate is exposed to multiple charged-particle beams simultaneously.

20. The method of claim 17, wherein the beam is deflected both by a mainfield deflector and also by a subfield deflector, and wherein said separately compensating step is applied to control at least said subfield deflector.

* * * * *